(12) United States Patent  (10) Patent No.: US 8,049,397 B2
Kato  (45) Date of Patent: Nov. 1, 2011

(54) LAMINATED PIEZOELECTRIC ELEMENT, JETTING DEVICE PROVIDED WITH THE LAMINATED PIEZOELECTRIC ELEMENT AND FUEL JETTING SYSTEM

(75) Inventor: Takeshi Kato, Kirishima (JP)

(73) Assignee: Kyocera Corporation, Kyoto (JP)

( * ) Notice: Subject to any disclaimer, the term of this patent is extended or adjusted under 35 U.S.C. 154(b) by 151 days.

(21) Appl. No.: 12/516,793

(22) PCT Filed: Nov. 29, 2007

(86) PCT No.: PCT/JP2007/073021
§ 371 (c)(1),
(2), (4) Date: Jun. 16, 2009

(87) PCT Pub. No.: WO2008/066098
PCT Pub. Date: Jun. 5, 2008

(65) Prior Publication Data
US 2010/0078505 A1  Apr. 1, 2010

(30) Foreign Application Priority Data
Nov. 29, 2006  (JP) ................................. 2006-320969

(51) Int. Cl.
*H01L 41/083* (2006.01)
(52) U.S. Cl. ....................................... 310/366; 310/328
(58) Field of Classification Search .................. 310/311, 310/328, 366
See application file for complete search history.

(56) References Cited

U.S. PATENT DOCUMENTS

| 7,567,020 B2 * | 7/2009 | Okamoto et al. ............. 310/328 |
| 7,851,974 B2 * | 12/2010 | Dollgast et al. ............... 310/328 |
| 2006/0066178 A1 * | 3/2006 | Lindner et al. ................ 310/328 |
| 2006/0238073 A1 | 10/2006 | Ragossnig et al. |
| 2006/0272910 A1 * | 12/2006 | Kraner ....................... 188/266.7 |
| 2008/0116768 A1 * | 5/2008 | Mochizuki et al. ........... 310/364 |
| 2010/0102138 A1 * | 4/2010 | Denzler et al. .................... 239/1 |
| 2010/0282874 A1 * | 11/2010 | Nakamura et al. ......... 239/585.1 |

FOREIGN PATENT DOCUMENTS

| JP | 11-087791 | 3/1999 |
| JP | 2000-269562 | 9/2000 |
| JP | 2003-224313 | 8/2003 |
| WO | WO 2007/049697 A1 * | 5/2007 |
| WO | WO 2008/049815 A1 * | 5/2008 |

* cited by examiner

*Primary Examiner* — Thomas Dougherty
(74) *Attorney, Agent, or Firm* — Procopio, Cory, Hargreaves & Savitch LLP

(57) ABSTRACT

There are some cases where cracks occur at a plurality of areas on an external electrode when a displacement quantity of a laminated piezoelectric element is large. In such cases, there is a possibility of a voltage not being applied to a portion of the laminated structure due to the cracks caused by a long time drive to cause a reduction in the displacement quantity. A low rigidity layer is arranged on the laminated structure to form a plurality of portions divided by the low rigidity layer in a laminating direction. Each portion is provided with power feeding members on the anode side and the cathode side. Thus, a voltage can be stably supplied to each internal electrode.

26 Claims, 17 Drawing Sheets

LAMINATED PIEZOELECTRIC ELEMENT, JETTING DEVICE PROVIDED WITH THE LAMINATED PIEZOELECTRIC ELEMENT AND FUEL JETTING SYSTEM

CROSS REFERENCE TO RELATED APPLICATIONS

This application is the U.S. National Stage application of PCT application PCT/JP2007/073021 filed on Nov. 29, 2007, which claims priority under 35 U.S.C. §119 to Japanese Patent Application No. 2006-320969, filed Nov. 29, 2006, and the contents of each of these applications are incorporated herein by reference in their entirety.

FIELD OF THE INVENTION

The present invention relates to a laminated piezoelectric element used for, for example, a driving element (piezoelectric actuator), a sensor element and a circuit element. Examples of the driving element include a fuel jetting device for an automobile engine, a liquid jetting device such as an ink-jet device, a precision positioning device for an optical apparatus or the like, and a vibration preventive device. Examples of the sensor element include a burning pressure sensor, a knocking sensor, an acceleration sensor, a load sensor, an ultrasonic sensor, a pressure-sensitive sensor and a yaw rate sensor. Examples of the circuit element include a piezoelectric gyroscope, a piezoelectric switch, a piezoelectric transformer and a piezoelectric breaker.

BACKGROUND

Conventionally, with respect to the laminated piezoelectric element, there have been strong demands for a small size element as well as for ensuring a large displacement quantity upon application of a large pressure. Consequently, the element needs to be subjected to a higher electric field, and also used under severe conditions of continuous driving operations for a long period of time. However, in an attempt to ensure the large displacement quantity, a higher stress is imposed on the external electrodes in response to the displacement of the piezoelectric member.

Therefore, an element having a structure in which conductors are connected to a plurality of portions of the external electrode has been proposed. By connecting many conductors to the external electrode, even when a plurality of cracks occur in the external electrode, it is possible to suppress the displacement quantity of the element from being lowered.

SUMMARY

There are some cases where cracks occur at a plurality of areas on an external electrode when a displacement quantity of a laminated piezoelectric element is large. In such cases, there is a possibility of a voltage not being applied to a portion of the laminated structure due to the cracks caused by a long time drive to cause a reduction in the displacement quantity. A low rigidity layer is arranged on the laminated structure to form a plurality of portions divided by the low rigidity layer in a laminating direction. Each portion is provided with power feeding members on the anode side and the cathode side. Thus, a voltage can be stably supplied to each internal electrode.

DETAILED DESCRIPTION

Figure 1:
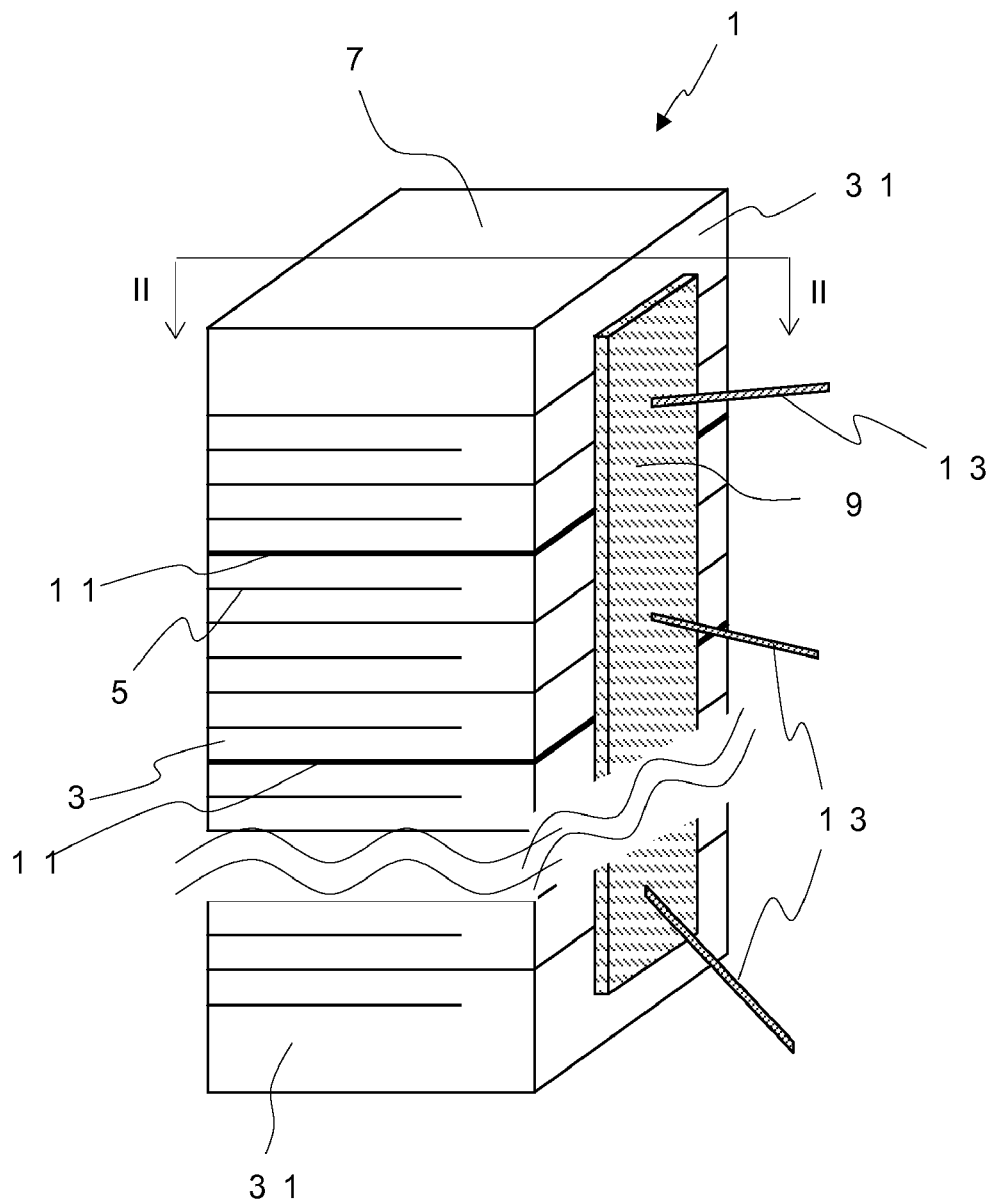
FIG. 1 is a perspective view showing a laminated piezoelectric element in accordance with a first embodiment of the present invention.

As shown in FIG. 1, a laminated piezoelectric element 1 (hereinafter, referred to also as "element 1") of the present embodiment is provided with a laminated structure 7 in which a plurality of piezoelectric layers 3 and a plurality of internal electrodes 5 are laminated alternately, and external electrodes 9 on an anode side and a cathode side (anode side external electrode and cathode side external electrode), which are formed on the side surfaces of the laminated structure 7, and to which the internal electrodes 5 are connected (anode side internal electrodes and cathode side internal electrodes). Moreover, the laminated structure 7 is provided with low rigidity layers 11 each of which is low in rigidity in comparison with the piezoelectric layers 3 and the internal electrodes 5, and is integrally fired with the piezoelectric layers 3 and the internal electrodes 5, and has a plurality of portions divided by the low rigidity layers 11 in a laminating direction. At least a pair of current-feeding units 13 (anode side current-feeding unit and cathode side current-feeding unit) (power supply members) electrically connected to the external electrodes 9 on the anode side and the cathode side are disposed on each portion.

In the present embodiment, the low rigidity layer 11 refers to a layer having a weak joining force inside the layer and/or a weak joining force to an adjacent layer, in comparison with the piezoelectric layers 3 and the internal electrodes 5. For this reason, cracks tend to occur inside the low rigidity layer 11 and/or on the interface to the adjacent layer.

In this manner, the low rigidity layer 11 tends to be damaged upon polarizing or firing in a manufacturing process of a laminated piezoelectric element 1 and during the use of the laminated piezoelectric element 1. For this reason, it is possible to generate a crack at a predetermined position in the laminated structure 7 by using the low rigidity layer 11. If a crack occurs in the piezoelectric layer 3, there is a possibility that an electrical short might develop between the adjacent internal electrodes 5. Moreover, when a crack occurs in the internal electrode 5, a portion is generated to which a voltage is not applied appropriately, resulting in a possibility of a reduction in displacement quantity of the element 1. Here, by installing the above-mentioned low rigidity layer 11, the possibility of occurrence of cracks in the internal electrode 5 and the piezoelectric layer 3 can be reduced. Consequently, it becomes possible to provide a highly reliable laminated piezoelectric element 1 that can be driven in a stable manner.

There are some cases where cracks occur at a plurality of areas on an external electrode when a displacement quantity of a laminated piezoelectric element is large. In such cases, there is a possibility of a voltage not being applied to a portion of the laminated structure due to the cracks caused by a long time drive to cause a reduction in the displacement quantity.

However, by installing the low rigidity layer 11, it is possible to generate a crack at a predetermined position; in other words, since a position to cause a crack is preliminarily recognized, the current-feeding units 13 to be electrically connected to the external electrodes 9 can be formed on a plurality of portions to be divided in a laminating direction by the low rigidity layers 11 without any loss.

Thus, the respective current-feeding units 13 are placed on the respective portions; therefore, even when cracks occur in a plurality of the low rigidity layers 11 by a long time use of the laminated piezoelectric element 1 to cause damages at a plurality of portions of the external electrodes 9, it is possible to apply a voltage to each of the internal electrodes 5 in a stable manner. Consequently, it becomes possible to prevent a reduction in the displacement quantity of the laminated piezoelectric element 1 due to the occurrence of cracks.

The rigidities of the low rigidity layer 11, the piezoelectric layer 3 and the internal electrode 5 can be easily compared, for example, by applying a load to the element in a direction perpendicular to a laminating direction. More specifically, it is determined by applying a load to the element 1 in the direction perpendicular to the laminating direction by using a JIS three-point bending test (JIS R 1601) or the like. It is only necessary to determine which portion of the element 1 is damaged upon carrying out the above-mentioned test. The damaged portion corresponds to a portion having the lowest rigidity in the element.

Since the laminated piezoelectric element 1 of the present embodiment is provided with the low rigidity layer 11, a damage preferentially occurs on the low rigidity layer 11 and/or on the interface between the low rigidity layer 11 and the piezoelectric layer 3, rather than on the piezoelectric layer 3 and the internal electrodes 5, when subjected to the JIS three-point bending test. In this manner, it is possible to determine whether the low rigidity layer 11 is present, based upon whether the damaged portion is generated on the piezoelectric layer 3 or the internal electrode 5, or on the low rigidity layer 11 or on the interface between the low rigidity layer 11 and the piezoelectric layer 3.

Here, it is only necessary to confirm which portion of the element 1 is subjected to a damage; therefore, in the case where a test piece is small, with the result that the JIS three-point bending test is not applied, the element 1 is processed to form a test piece having a rectangular pillar shape in compliance with the JIS three-point bending test, and the test piece is placed between two fulcrums apart from each other with a predetermined distance, and by applying a load onto a point in the center of the fulcrums, the presence or absence of the low rigidity layer 11 can be determined.

The low rigidity layer 11 is allowed to have rigidity lower than that of the piezoelectric layer 3 and the internal electrode 5 by using a material having rigidity lower than that of the piezoelectric layer 3 and the internal electrode 5, or by using a structure with many pores formed therein, as will be described later.

Moreover, in the case where the low rigidity layers are formed by being integrally fired together with the piezoelectric layers and the internal electrodes, it is not necessary to use a laminated structure having a plurality of laminated layers formed with an elastic conductive bonding member being interposed therebetween. For this reason, it is possible to eliminate a process used for joining a plurality of piezoelectric elements to one another by the conductive bonding member. As a result, it is possible to easily manufacture a laminated piezoelectric element.

In the present embodiment, the rigidities of the low rigidity layer 11, the piezoelectric layer 3 and the internal electrode 5 can also be evaluated by using the Young's modulus. This is because the low rigidity layer 11 having rigidity smaller than the piezoelectric layer 3 and the internal electrode 5 also has a smaller Young's modulus in comparison with those of the piezoelectric layer 3 and the internal electrode 5. The reason that the Young's modulus of the low rigidity layer 11 is small is because, for example, as will be described later, it has many voids formed therein in comparison with the piezoelectric layer 3 and the internal electrode 5.

For example, a nano-indentation method may be used as the measuring method of the Young's modulus. For example, a "Nano-Indenter II" made by Nano-Instruments Co., Ltd. may be used as the measuring device. On a cross section perpendicular to, or in parallel with the laminating direction of the laminated structure 7, the low rigidity layer 11, the piezoelectric layer 3 or the internal electrode 5 is exposed, and the Young's modulus thereof can be measured by using the measuring device.

Next, the following description will discuss a second embodiment of the present invention.

Figure 3:
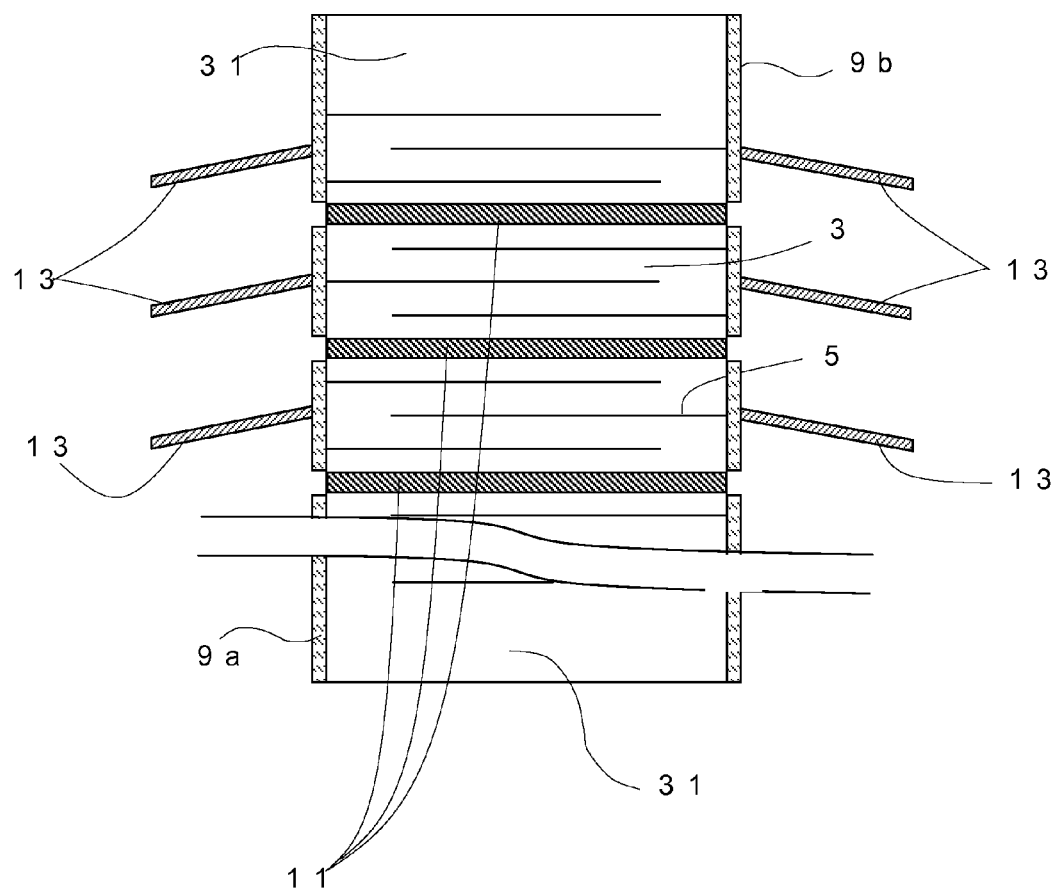
FIG. 3 is a cross-sectional view showing a laminated piezoelectric element in accordance with a second embodiment of the present invention.

As shown in FIG. 3, the laminated piezoelectric element 1 is provided with a laminated structure 7 in which a plurality of piezoelectric layers 3 and a plurality of internal electrodes 5 are laminated alternately, and external electrodes 9 (power supply members) on an anode side and a cathode side, which are formed on the side surfaces of the laminated structure 7, and to which the internal electrodes 5 are connected. Here, the laminated structure 7 is provided with low rigidity layers 11 each of which has low rigidity in comparison with the piezoelectric layers 3 and the internal electrodes 5, and is integrally fired with the piezoelectric layers 3 and the internal electrodes 5. Moreover, the external electrodes 9 are separated from each other to one side and the other side on the side surface of the laminated structure 7 in a laminating direction based upon the low rigidity layer 11.

In the present embodiment, the low rigidity layer 11 refers to a layer having lower rigidity in comparison with the piezoelectric layer 3 and the internal electrode 5. In the same manner as in the first laminated piezoelectric element 1 of the present invention, the rigidities of these can be evaluated by using a JIS three-point bending test (JIS R 1601), a test in compliance with the JIS three-point bending test, or a measuring process of the Young's modulus. Here, in the same manner as in the first laminated piezoelectric element 1 of the present invention, the low rigidity layer 11 also refers to a layer having a weak joining force inside the layer and/or a weak joining force to an adjacent layer, in comparison with the piezoelectric layers 3 and the internal electrodes 5. For this reason, cracks easily occur inside the low rigidity layer 11 and/or on the interface to the adjacent layer.

Moreover, in the present embodiment, the external electrodes 9 are separated from each other to one side and the other side on a side surface of the laminated structure 7 in the laminating direction based upon the low rigidity layer 11. Since the external electrodes 9 are separated from each other, that is, since a disconnection section having a predetermined shape is preliminarily formed in the external electrodes 9, influences to the external electrode 9 from cracks caused in the low rigidity layer 11 can be reduced. With this arrangement, it becomes possible to reduce the possibility of an occurrence of a crack in an unexpected direction in the external electrode 9.

The external electrodes 9 are separated from each other to one side and the other side on the side surface of the laminated structure 7 in the laminating direction based upon the low rigidity layer 11. In this case, the gap between the external electrodes 9 is preferably set to 0.1 to 2 times as long as the average thickness of the low rigidity layer 11. By setting the gap to not less than 0.1 times as long, the influences of cracks occurring in the low rigidity layer 11 can be reduced. Moreover, by setting the gap to not more than 2 times as long, predetermined voltages can be applied to the respective internal electrodes 5 in a stable manner.

By electrically connecting current-feeding units 13 to the respective external electrodes 9 that are positioned at the respective portions and separated from each other, predetermined voltages can be applied to the respective internal electrodes 5 in a stable manner. Consequently, it becomes possible to provide a highly reliable laminated piezoelectric element 1 that is operable in a stable manner.

Next, the following description will discuss a third embodiment of the present invention.

Figure 4:
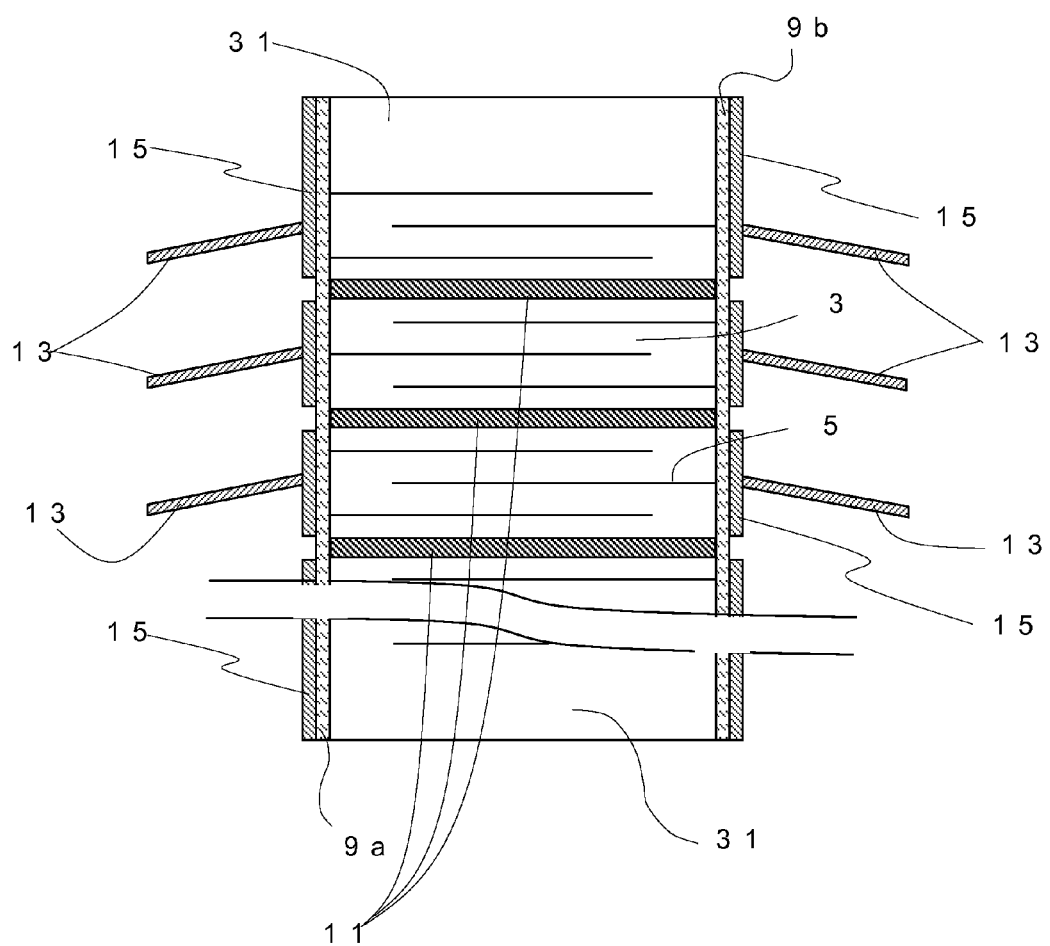
FIG. 4 is a cross-sectional view showing a laminated piezoelectric element in accordance with a third embodiment of the present invention.

As shown in FIG. 4, the laminated piezoelectric element 1 is provided with a laminated structure 7 in which a plurality of piezoelectric layers 3 and a plurality of internal electrodes 5 are laminated alternately, external electrodes 9 on an anode side and a cathode side, which are formed on the side surfaces of the laminated structure 7, and to which the internal electrodes 5 are connected, and conductive bonding members 15 (power supply members) that are placed on the outer surfaces of the external electrodes 9. Here, the laminated structure 7 is provided with low rigidity layers 11 each of which is low in rigidity in comparison with the piezoelectric layers 3 and the internal electrodes 5, and is integrally fired with the piezoelectric layers 3 and the internal electrodes 5. Moreover, the conductive bonding members 15 are separated from each other to one side and the other side on the side surface of the laminated structure 7 in a laminating direction based upon the low rigidity layer 11.

In the present embodiment, the low rigidity layer 11 refers to a layer having lower rigidity in comparison with the piezoelectric layer 3 and the internal electrode 5 in the same manner as in the first laminated piezoelectric element 1 of the present invention, and the rigidities thereof can be evaluated by a JIS three-point bending test (JIS R 1601), a test in compliance with the JIS three-point bending test, or a measuring process of the Young's modulus. Here, in the same manner as in the first laminated piezoelectric element 1 of the present invention, since the low rigidity layer 11 is a layer having a weak joining force inside the layer and/or a weak joining force to an adjacent layer, in comparison with the piezoelectric layers 3 and the internal electrodes 5, cracks easily occur inside the low rigidity layer 11 and/or on the interface to the adjacent layer.

Moreover, in the present embodiment, the conductive bonding members 15 are separated from each other to one side and the other side on the side surface of the laminated structure 7 in the laminating direction based upon the low rigidity layer 11. Since the conductive bonding members 15 are separated from each other, that is, since a disconnection section having a predetermined shape is preliminarily formed in the conductive bonding members 15, even upon occurrence of a crack in the low rigidity layer 11, it becomes possible to reduce the possibility of an occurrence of a crack in an unexpected direction in the conductive bonding members 15.

In the present embodiment, the conductive bonding members 15 are used for joining the external electrodes 9 to the current-feeding units 13. Here, in some cases, the conductive bonding members 15 are formed on the outer surface of each external electrode 9 in a layer state. This arrangement is made so as to simplify the process for forming the conductive bonding members 15 on the side surface of the laminated structure 7 and so as to positively join the external electrode 9 and the current-feeding unit 13 to each other. In the case where each of the conductive bonding members 15 is formed in the layer state in this manner, the above-mentioned separated structure of the conductive bonding members 15 functions more effectively.

The thickness of the conductive bonding members 15 is preferably set to 10 µm to 200 µm. The thickness of 10 µm or more makes it possible to more positively apply predetermined voltages to the respective internal electrodes 5. Moreover, the thickness of 200 µm or less makes the conductive bonding members less susceptible to cracks even upon application of a stress caused by repetitive driving operations of the laminated piezoelectric element 1.

Here, the conductive bonding members 15 are separated from each other to one side and the other side on the side surface of the laminated structure 7 in the laminating direction based upon the low rigidity layer 11. At this time, the gap between the conductive bonding members 15 is preferably set to 0.1 to 3 times as long as the average thickness of the low rigidity layer 11. By setting the gap to not less than 0.1 times as long, the influences of cracks occurring in the low rigidity layer 11 can be reduced. Moreover, by setting the gap to not more than 3 times as long, predetermined voltages can be applied to the respective internal electrodes 5 in a stable manner.

Not particularly limited, any material may be used as the conductive bonding member 15 as long as it electrically connects each of the external electrodes 9 on the anode side and the cathode side to the current-feeding units 13. Therefore, specific materials for the conductive bonding member 15 include solder, wax material and conductive resins. In particular, from the viewpoint of durability of a joined portion between the external electrodes 9 and the current-feeding units, solder using an alloy of lead, tin and silver is preferably used.

By electrically connecting the external electrodes 9 to the current-feeding units 13 by using the conductive bonding members 15 that are separated from each other as described above, predetermined voltages are consequently applied to the respective internal electrodes 5 in a stable manner. Thus, it becomes possible to provide a highly reliable laminated piezoelectric element 1 that is operable in a stable manner.

Next, the following description will discuss a fourth embodiment of the present invention.

Figure 5:
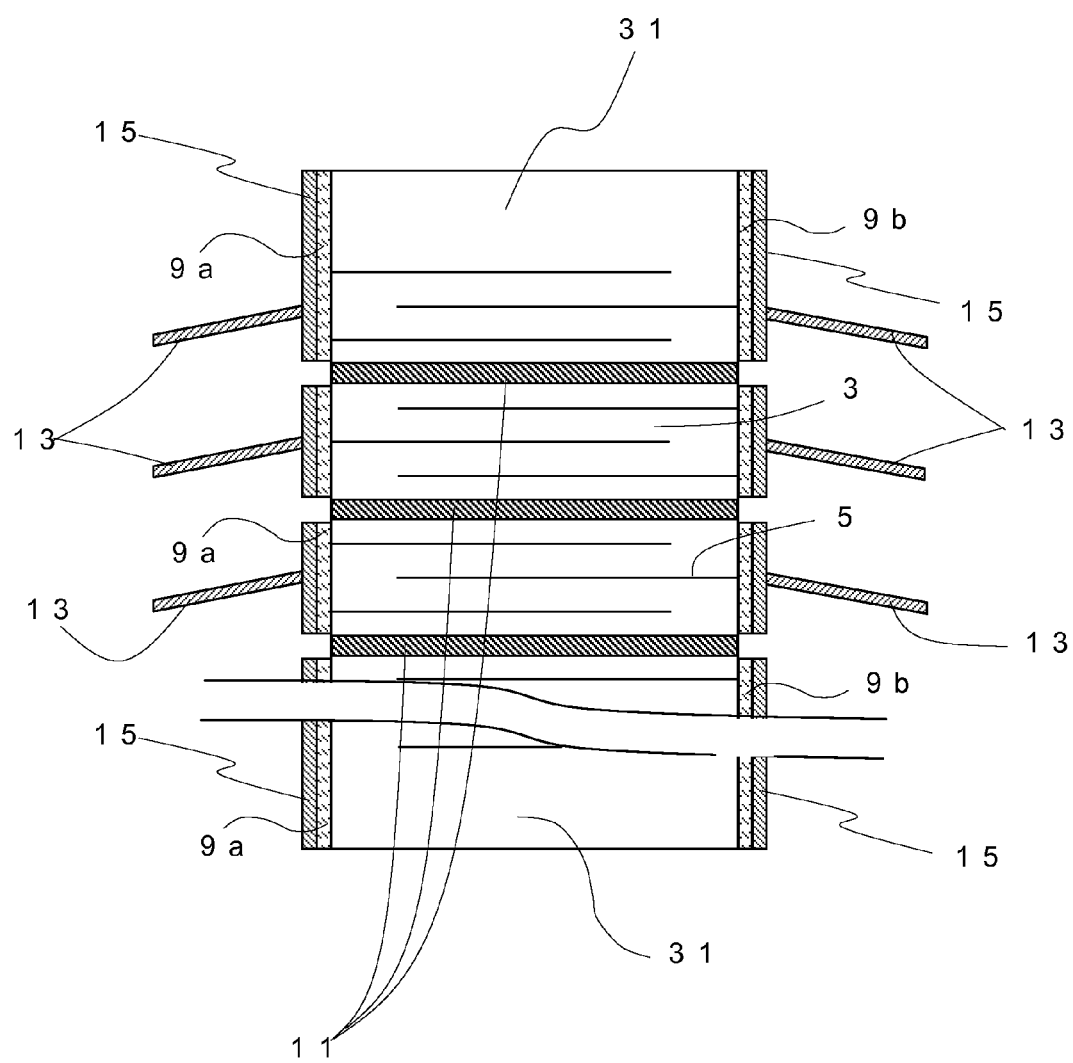
FIG. 5 is a cross-sectional view showing a laminated piezoelectric element in accordance with a fourth embodiment of the present invention.

As shown in FIG. 5, the laminated piezoelectric element 1 is preferably designed so that, the external electrodes 9 are separated from each other to one side and the other side on the side surface of a laminated structure 7 in the laminating direction based upon the low rigidity layer 11. By separating each external electrode 9 and each conductive bonding member 15 mutually in this manner, it becomes possible to prevent an unexpected crack from occurring in both of the external electrode 9 and conductive bonding member 15. Consequently, it is possible to apply predetermined voltages to the internal electrodes 5 more positively. As a result, it becomes possible to provide a laminated piezoelectric element 1 that is superior in durability, and is continuously operable for a long period of time in a stable manner, even under high electric field and high pressure.

Here, the piezoelectric layers 3 are preferably made adjacent to each low rigidity layer 11 on both of the sides in its laminating direction. In the case where the piezoelectric layers 3 are made adjacent to the low rigidity layer 11 on both of the sides in the laminating direction, since the low rigidity layer 11 is sandwiched by the piezoelectric members having a high insulating property, it is possible to effectively prevent an electrical short from occurring through a crack generated in the low rigidity layer 11.

More specifically, since the piezoelectric layers 3 are made adjacent to the low rigidity layer 11 on both of the sides in the laminating direction, even upon occurrence of a crack in the low rigidity layer 11, it becomes possible to reduce the possibility of the internal electrode 5 adjacent to the low rigidity layer 11 in the laminating direction exposing to the crack face. Consequently, it is possible to prevent an electrical short from occurring through a crack generated in a gap between the low rigidity layer 11 and the internal electrode 5 adjacent thereto in the laminating direction and/or a gap between the internal electrode 5 and the external electrode 9.

As a material for the low rigidity layer 11, any material may be used as long as it has a low rigidity in comparison with the piezoelectric layer 3 and the internal electrodes 5 and it can be integrally fired together with the piezoelectric layer 3 and the internal electrodes 5. Specific examples thereof include metal of a simple substance, such as Cu and Ni, and an alloy, such as a silver-platinum alloy and a silver-palladium alloy. In particular, from the viewpoints of providing a migration resistance, an anti-oxidation property, a low Young's modulus and a low price, a silver-palladium alloy is preferably used as its main component.

Moreover, the low rigidity layer 11 may be formed by using a metal component as its main component, as described above, or may be made from ceramics or the like.

Next, the following description will discuss a fifth embodiment of the present invention.

Figure 6:
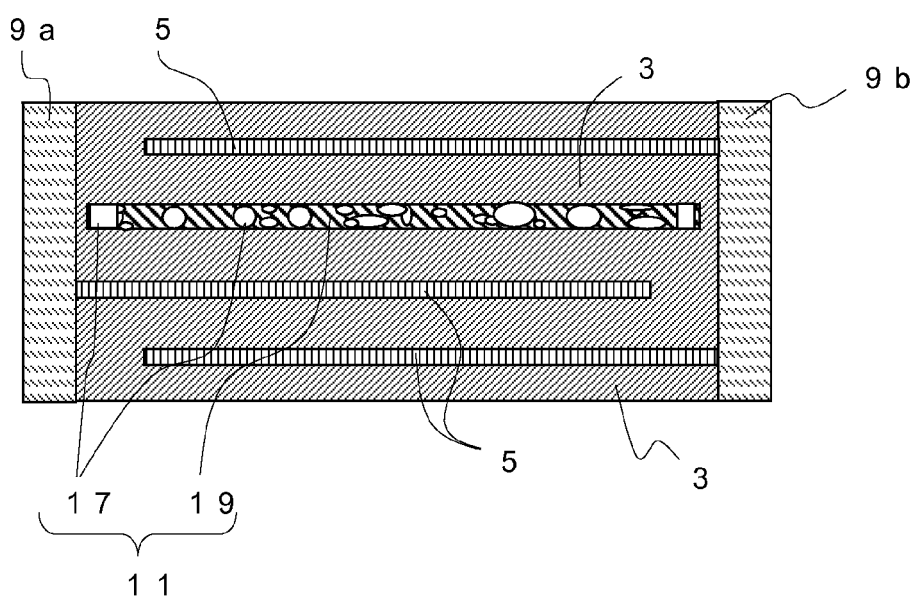
FIG. 6 is a cross-sectional view in a direction in parallel with a laminating direction, which shows a laminated piezoelectric element in accordance with a fifth embodiment of the present invention.
Figure 7:
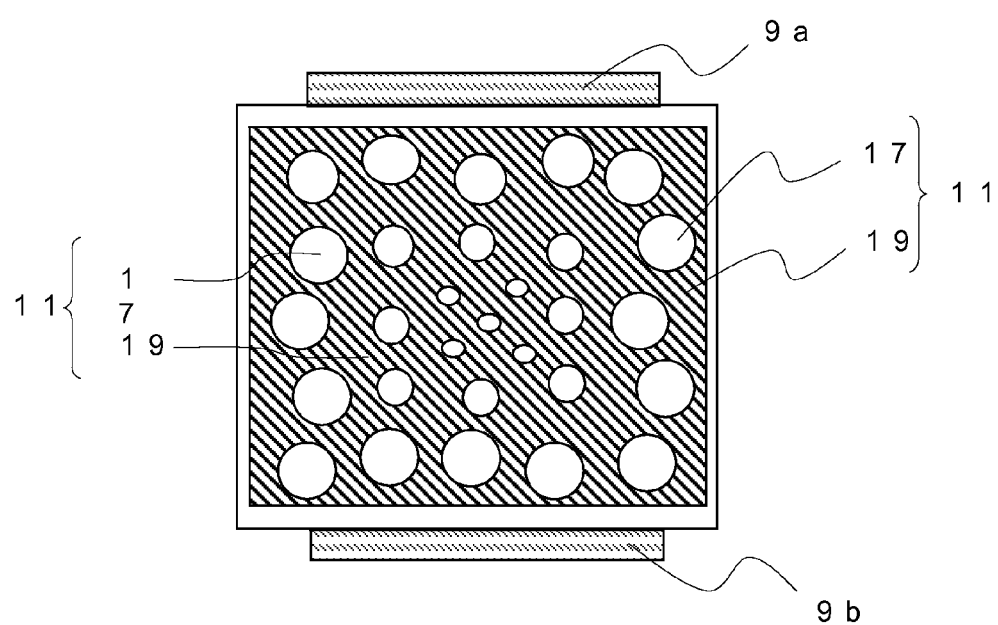
FIG. 7 is a cross-sectional view taken along a direction perpendicular to the laminating direction of the embodiment shown in FIG. 6, which shows a plane including a low rigidity layer.

As shown in FIGS. 6 and 7, many voids 17 are formed in a low rigidity layer 11, and the low rigidity layer 11 has a void ratio higher than those of the internal electrode 5 and the piezoelectric layer 3. For this reason, the layer is further low in its rigidity in comparison with the piezoelectric layer 3 and the internal electrodes 5. With this arrangement, sites where cracks occur can be more positively concentrated on the low rigidity layer 11 so that the possibility of cracks occurring in the internal electrodes 5 and piezoelectric layers 3 can be reduced. Moreover, in the case where many voids 17 are formed in the low rigidity layer 11, even if a layer adjacent to the low rigidity layer 11 in the laminating direction is deformed by a driving operation, the resulting stress can be absorbed by these voids 17, and consequently alleviated. Thus, it becomes possible to suppress the occurrence of cracks in the adjacent layers.

Moreover, the low rigidity layer 11 is preferably provided with a plurality of metal portions 19 that are separated from one another. By forming the low rigidity layer 11 into this structure, the joining force inside the low rigidity layer 11 and/or the joining force between the adjacent layers can be lowered. Consequently, the rigidity of the low rigidity layer 11 can be made further lower.

The composition of the low rigidity layer 11 provided with the metal portions 19 can be measured, for example, in the following manner. That is, first, the laminated structure 7 is cut so that the metal portions 19 of the low rigidity layer 11 are exposed. Then, one portion of the low rigidity layer 11 is sampled. Next, by carrying out a chemical analysis such as an ICP (Inductive Coupling Plasma) light emission analysis or the like, the composition of the low rigidity layer 11 can be measured. Alternatively, the cut face of the laminated piezoelectric element 1 may be analyzed and measured by using an EPMA (Electron Probe Micro Analysis) method. Here, in some cases, not only the metal component, but also components other than the metal, such as voids and/or ceramic components, are contained in the cut face of the laminated piezoelectric element 1. Even in such a case, the low rigidity layer 11 can be observed under an SEM (Scanning-type Electron Microscope) or under a metal microscope. Moreover, the low rigidity layer 11 can be analyzed by the EPMA method.

Moreover, the low rigidity layer 11 preferably has a structure in which a large number of metal portions 19 having mutually different sizes are placed at random. In the case where there are big deviations in stress inside a single low rigidity layer 11, the formation of the low rigidity layer 11 into the above-mentioned structure is in particular effective. This structure makes it possible to reduce the possibility of the stress concentrating locally inside the single low rigidity layer 11, and consequently to disperse the stress over a wider range inside the single low rigidity layer 11.

The following description will discuss a sixth embodiment of the present invention.

Figure 8:
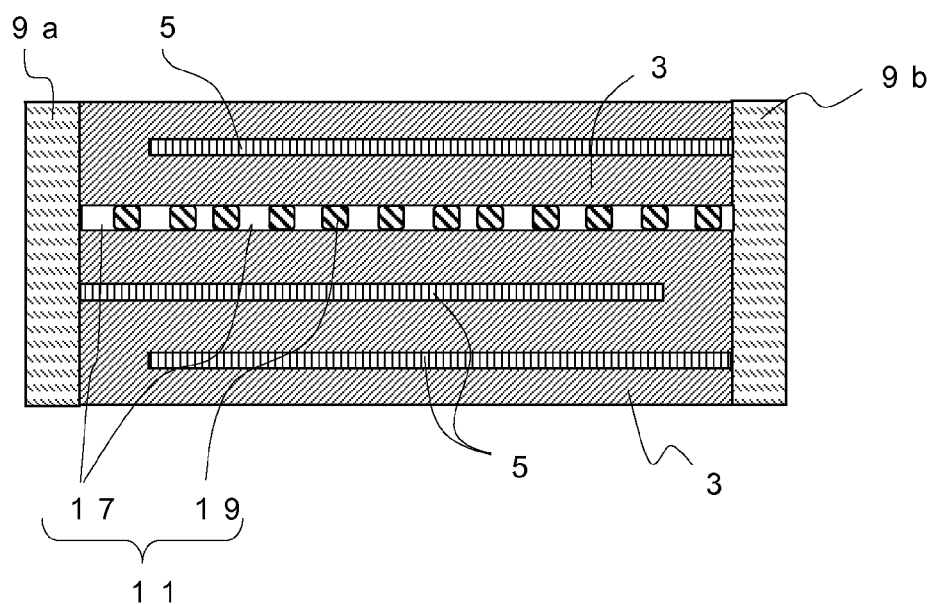
FIG. 8 is a cross-sectional view in a direction in parallel with a laminating direction, which shows a laminated piezoelectric element in accordance with a sixth embodiment of the present invention.
Figure 9:
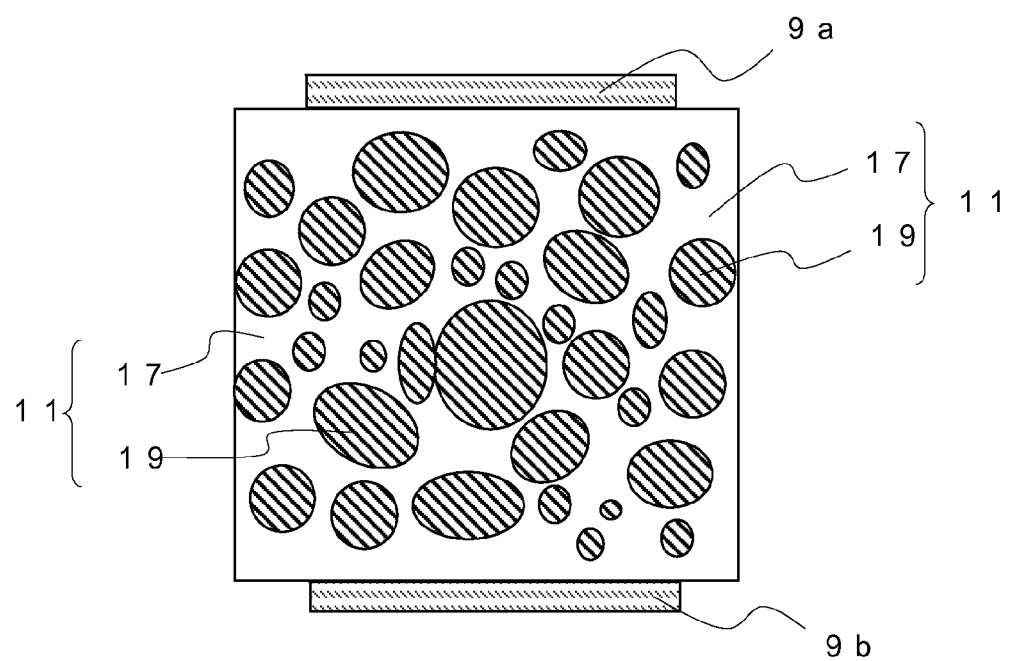
FIG. 9 is a cross-sectional view taken along a direction perpendicular to the laminating direction of the embodiment shown in FIG. 8, which shows a plane including a low rigidity layer.
Figure 10:
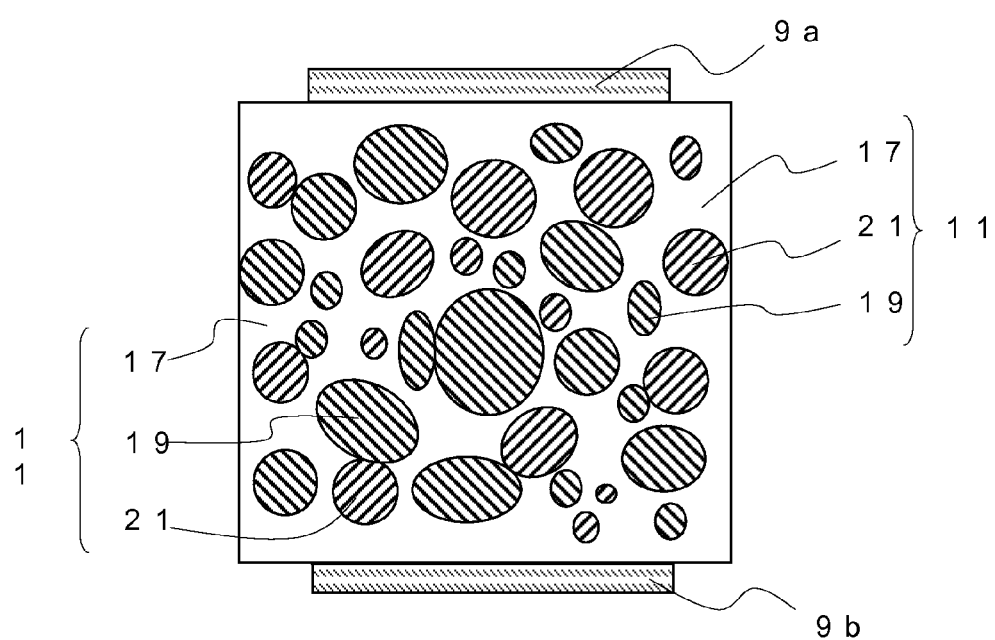
FIG. 10 is a cross-sectional view in a direction perpendicular to a laminating direction, which shows a plane including a low rigidity layer relating to a laminated piezoelectric element in accordance with a seventh embodiment of the present invention.

As shown in FIGS. 8 and 9, the low rigidity layer 11 preferably has a plurality of metal portions 19 that are mutually separated from one another with a void 17 interposed therebetween. The low rigidity layer 11 has the plurality of the metal portions 19 that are mutually separated from one another with the void 17 interposed therebetween. With this arrangement, sites where cracks occur can be more positively concentrated on the low rigidity layer 11. Thus, it becomes possible to further reduce the possibility of cracks occurring in the internal electrodes 5 and piezoelectric layer 3. Moreover, since the metal portions 19 that are mutually separated from one another are prepared, it is possible to further reduce the possibility of an electrical short occurring through a crack generated in the low rigidity layer 11.

Here, the void ratio refers to a rate (%) of the area occupied by the voids 17 relative to the cross-sectional area of the laminated structure 7 on a cross section perpendicular to, or in parallel with a laminating direction of the laminated structure 7.

In order to measure the void ratio, for example, the following processes are carried out. First, a laminated structure 7 is subjected to a grinding process by using a known grinding means so that the cross section perpendicular to the laminating direction is exposed. More specifically, the grinding process is carried out by using, for example, a bench grinding machine KEMET-V-300 made by Kemet Japan Co., Ltd. as the grinding device, with diamond paste being applied thereto. The cross section, thus exposed by the grinding process, is observed by using, for example, a scanning electron microscope (SEM), an optical microscope, a metal microscope, or the like so that a cross-sectional image is obtained. The void ratios of the internal electrodes 5 and the low rigidity layer 11 can be measured by image-processing the cross-sectional image.

More specifically, with respect to the image of the internal electrodes 5 and the low rigidity layer 11 photographed through the optical microscope, void portions are painted into black solid portions, while the other portions except for the void portions are painted into white solid portions. Then, the ratio of the black portions, that is, (the area of black portions)/(the area of black portions+the area of white portions), is found, and this is indicated by percentage so that the void ratio can be calculated. Moreover, in the case where the cross-sectional image is provided as a colored image, the image is converted into gray scales so as to be divided into black portions and white portions. In the case where, at this time, in an attempt to divide into two gradations of black portions and white portions, a threshold value needs to be set for the border, the binarizing process may be carried out by setting the threshold value of the border visually or by the use of image processing software.

Here, the void ratio of the low rigidity layer 11 is preferably set to 10% to 95%. In the case of the void ratio of 10% or more, it is possible to effectively suppress cracks occurred in the low rigidity layer 11 from developing toward the piezoelectric layer 3 and/or the internal electrodes 5. Moreover, in the case of 95% or less, it is possible to maintain the outer shape of the laminated piezoelectric element 1 in a stable manner.

Moreover, the low rigidity layer 11 is preferably provided with a plurality of ceramic portions 21 that are separated from one another. This arrangement is made so that, since the ceramic portions 21 themselves are successively damaged, a stress, caused by the displacement of the piezoelectric layer 3, can be dispersed over a wide range. Thus, it is possible to provide a highly reliable laminated piezoelectric element 1 with high durability.

More specifically, a perovskite-type oxide, such as lead-zirconate-titanate ($PbZrO_3$—$PbTiO_3$), can be used as the ceramic portions 21. The component of the ceramic portions 21 can be analyzed and measured by using an analyzing method, such as an EPMA method, as described earlier.

Moreover, the low rigidity layer 11 preferably has a structure in which a large number of ceramic portions 21 having mutually different sizes are placed at random. In the case where there are big deviations in stress inside a single low rigidity layer 11, the formation of the low rigidity layer 11 into the above-mentioned structure is in particular effective. This structure makes it possible to reduce the possibility of the stress concentrating locally a part of the low rigidity layer 11, and consequently to disperse the stress over a wider range therein.

Furthermore, the low rigidity layer 11 is preferably provided with a plurality of ceramic portions 21 that are separated from one another with a void 17 interposed therebetween. This arrangement is made so that, since the ceramic portions 21 themselves are more easily damaged, a stress caused by the displacement of the piezoelectric layer 3, can be dispersed over a wide range. In this case, the void ratio of the low rigidity layer 11 is preferably set to 30% to 90%.

In the case of the void ratio of 30% or more in the low rigidity layer 11, the stress dispersing effect by the low rigidity layer 11 is enhanced so that it is possible to provide a highly reliable laminated piezoelectric element 1. Moreover, the void ratio is more preferably set to 50% or more. Thus, when a stress is transmitted to the piezoelectric layer 3 that is in contact with the low rigidity layer 11, the respective ceramic portions 21 can be deformed greatly in response to the stress. Consequently, the stress dispersing effect of the element is further enhanced so that it becomes possible to provide, in particular, a highly reliable laminated piezoelectric element 1.

Moreover, in the case of the void ratio of 90% or less in the low rigidity layer 11, even when the element 1 is used for a long period of time, it is possible to suppress the dimension of the element from changing, and consequently to provide a stable driving operation. This effect is obtained because the low rigidity layer 11 is mainly formed by pillar-shaped ceramic portions 21. The piezoelectric layers 3 made in contact with the low rigidity layer 11 are supported by these ceramic portions 21. With this arrangement, even if the low rigidity layer 11 is damaged, it is not damaged abruptly, but damaged gradually from a portion on which a stress is concentrated. As a result, the element drive-controlling system is allowed to detect any abnormality with sufficient safety margins and the driving operation of the element can be controlled in detail externally by a signal controlling circuit.

Here, in the present embodiment, as described earlier, the void ratio refers to a rate (%) of the area occupied by the voids 17 relative to the cross-sectional area of the low rigidity layer 11 on a cross section perpendicular to, or in parallel with a laminating direction of the laminated structure 7. Moreover, the method described earlier may be used as a method for measuring the void ratio.

The following description will discuss a seventh embodiment of the present invention.

As shown in 10, the low rigidity layer 11 is provided with a plurality of metal portions 19 and a plurality of ceramic portions 21 that are mutually separated from one another so that a laminated piezoelectric element 1 that is superior in durability can be achieved.

This is achieved because, in response to an abrupt stress, the ceramic portions 21 exert a superior stress alleviating effect, and because in response to a stress that is always applied, the metal portions 19 exert a superior stress alleviating effect. Consequently, since stresses in various modes can be dealt, it becomes possible to provide a laminated piezoelectric element 1 that is extremely superior in durability.

Moreover, the low rigidity layer 11 is provided with the metal portions 19 and the ceramic portions 21, and each of the metal portions 19 and each of the ceramic portions 21 are preferably designed to have portions that are made in contact with each other. When the low rigidity layer 11 is formed in this manner, the stress alleviating effect is exerted more greatly. As described earlier, the metal portions 19 and the ceramic portions 21 have respective features in their stress-alleviating functions and effects. Here, when each metal portion 19 and each ceramic portion 21 are made in contact with each other, the respective features in their stress-alleviating effects are obtained, since these portions are allowed to function integrally.

At this time, the portions 19 and the ceramic portions 21 are preferably set to virtually the same ratio. Thus, the respective effects are efficiently exerted so that it becomes possible to provide a laminated piezoelectric element 1 that is extremely superior in durability. Here, the ratio refers to a ratio between the total area of the metal portions 19 and the total area of the ceramic portions 21 on a cross section perpendicular to, or in parallel with the laminating direction of the laminated structure 7.

Moreover, each ceramic portion 21 is preferably formed by a piezoelectric member. By forming each ceramic portion 21 by the piezoelectric member, a higher stress alleviating effect is exerted. This is because, by placing the piezoelectric members so as to be separated from each other, the ceramic portions 21 serving as the piezoelectric members are allowed to have a higher degree of freedom. In the case where the degree of freedom in the ceramic portions 21 becomes higher, upon occurrence of a stress in each ceramic portion 21, ion positions inside the piezoelectric crystal are moved so that the crystal structure is easily deformed in response to the direction of the stress. Thus, it becomes possible to obtain a high stress-alleviating effect.

Here, the thickness of the low rigidity layer 11 is preferably set to 1 to 20 μm. In the case of the thickness of 1 μm or more, since the low rigidity layer 11 is easily deformed, the stress can be dispersed over a wide range. Moreover, in the case of the thickness of 20 μm or less, it is possible to stabilize a position where a rupture occurs in the low rigidity layer 11.

Moreover, the laminated structure 7 is preferably designed to have a plurality of low rigidity layers 11 in the laminating direction. More specifically, a low rigidity layer 11 is preferably disposed for every 5 to 300 piezoelectric layers 3. By disposing a low rigidity layer 11 for every 5 or more piezoelectric layers 3, the binding force of the piezoelectric layers 3 is improved so that the joining strength to the piezoelectric layers 3 can be improved. Moreover, by disposing a low rigidity layer 11 for every not less than 300 piezoelectric layers 3, the binding force of the piezoelectric layers 3 can be sufficiently dispersed.

Moreover, a plurality of low rigidity layers 11 are installed, and these are preferably disposed regularly in the laminating direction. By regularly disposing these, the entire binding force of the laminated structure 7 is dispersed, and it is possible to suppress a reduction in the amount of change in piezoelectric displacement even during a driving operation under a low temperature for a long period of time, and consequently to provide a stable driving operation for a long period of time.

For example, by setting the number of the piezoelectric layers 3 to be disposed between the respective low rigidity layers 11 to the same number, the gap between the respective low rigidity layers 11 is formed into a fixed distance so that it is possible to provide a simple structure that is easily manufactured, and also to prevent cracks from occurring on portions other than the low rigidity layers 11.

The following description will discuss an eighth embodiment of the present invention.

Figure 11:
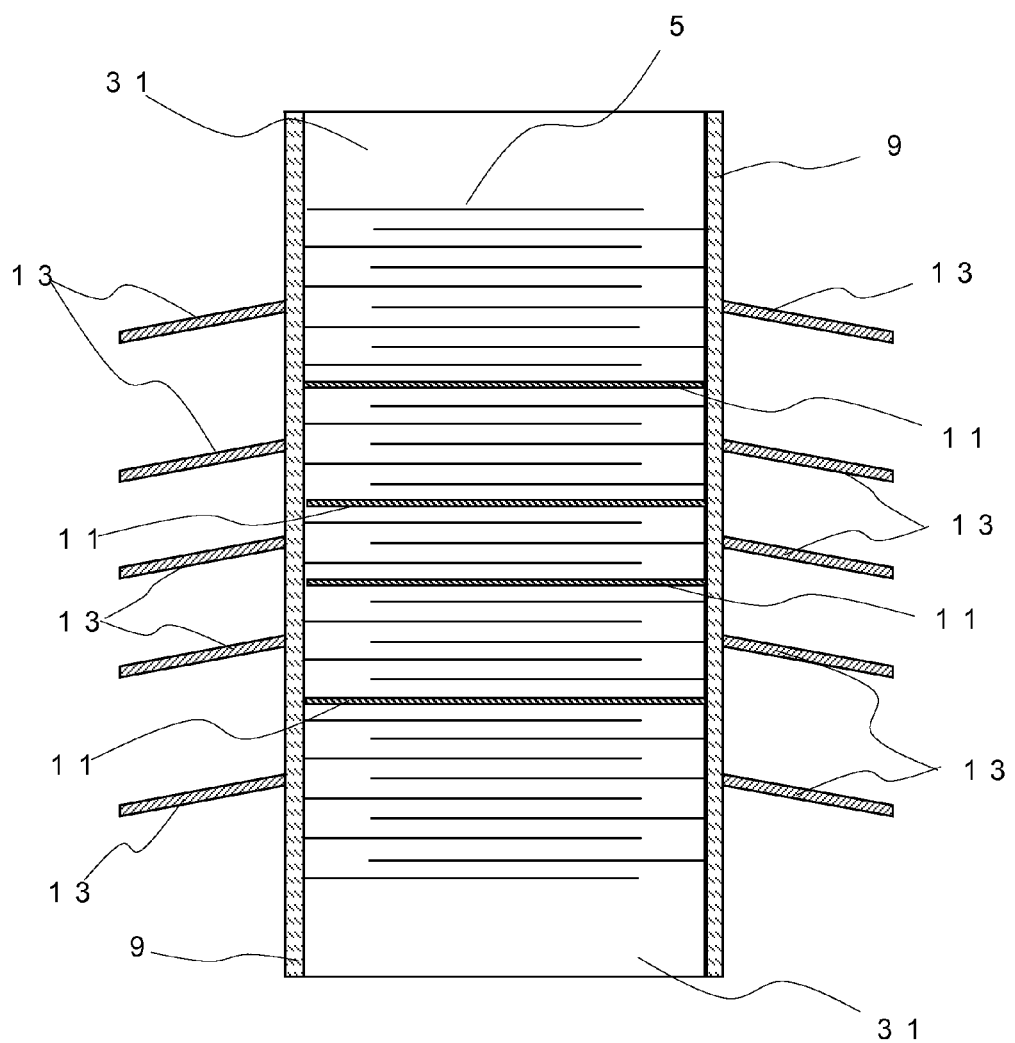
FIG. 11 is a cross-sectional view showing a laminated piezoelectric element in accordance with an eighth embodiment of the present invention.

Here, the low rigidity layers 11 may be disposed with fixed intervals in the laminating direction of the laminated structure 7, or may be disposed with gradually widening intervals from the center in the laminating direction toward the two end faces, as shown in FIG. 11. Thus, since the stress is concentrated on the vicinity of the center of the laminated structure 7, this layout of the low rigidity layers 11 makes it possible to suppress concentration of the stress, and consequently to disperse the stress. With this arrangement, it is possible to suppress a strain from occurring in the laminated structure 7 upon application of a voltage.

Moreover, for example, another structure may be used in which, in the vicinity of the center of the laminated structure 7 on which the stress is concentrated, a plurality of the low rigidity layers 11 are disposed with fixed intervals, and on the two ends of this portion in which the low rigidity layers 11 are disposed with fixed intervals, the low rigidity layers 11 are disposed with gradually increasing intervals. With this structure, the stress is prevented from being concentrated, while being dispersed, and it is possible to manufacture a laminated piezoelectric element 1 having a large displacement quantity.

The following description will discuss a ninth embodiment of the present invention.

Figure 12:
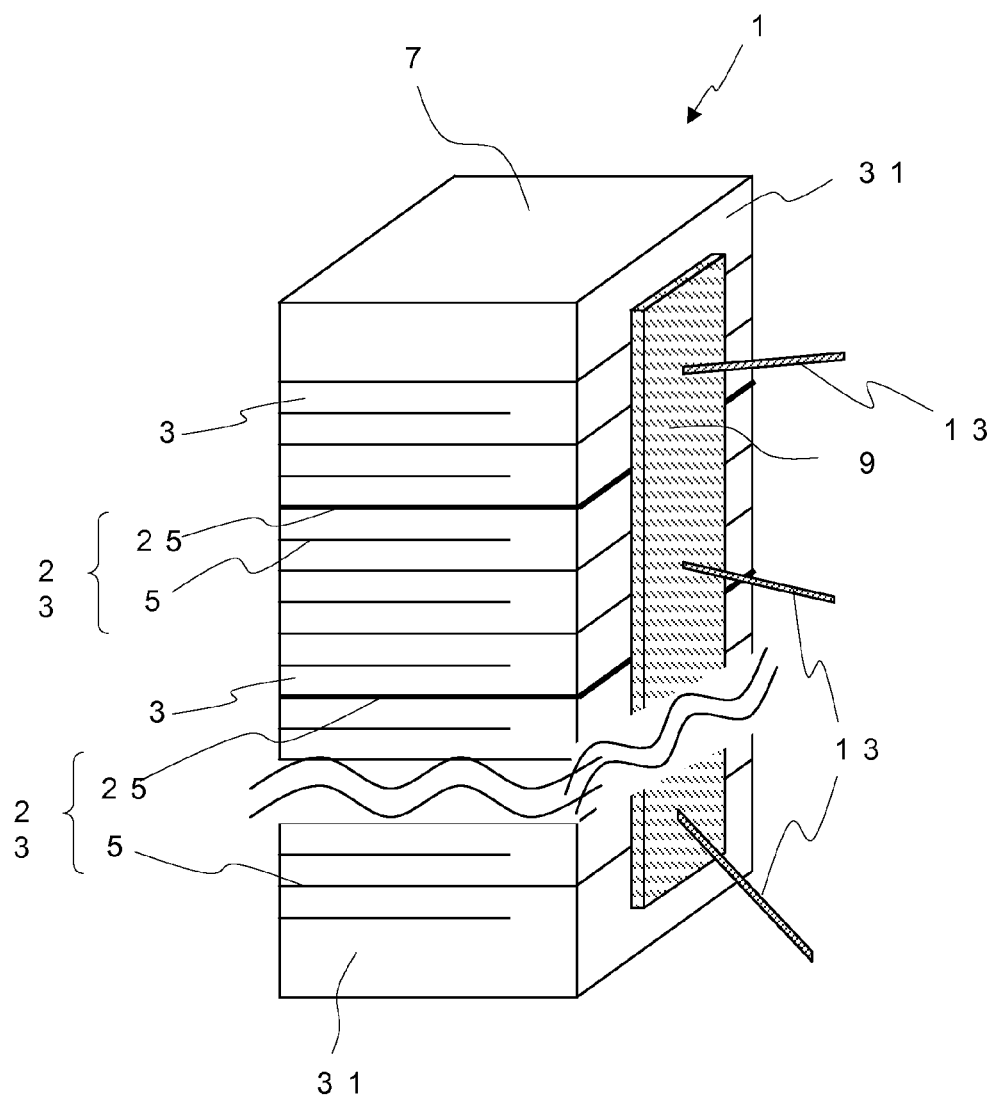
FIG. 12 is a perspective view showing a laminated piezoelectric element in accordance with a ninth embodiment of the present invention.

As shown in FIG. 12, a laminated piezoelectric element 1 is provided with a laminated structure 7 in which a plurality of piezoelectric layers 3 and a plurality of metal layers 23 are alternately laminated and external electrodes 9 on an anode side and a cathode side, which are formed on the side surfaces of the laminated structure 7. Each metal layer 23 is provided with internal electrodes 5 that are connected to the external electrodes 9 on the anode side and the cathode side, and low rigidity metal layers 25 having low rigidity in comparison with the piezoelectric layers 3 and the internal electrodes 5. Moreover, the laminated structure 7 has a plurality of portions that are divided by the low rigidity metal layers 25 in a laminating direction. At least a pair of current-feeding units 13 (power supply members) electrically connected to the external electrodes 9 on the anode side and the cathode side are disposed on each portion.

In the present embodiment, the low rigidity metal layer 25 refers to a layer that is low in rigidity in comparison with the piezoelectric layers 3 and the internal electrodes 5, and has a weak joining force inside the layer and/or a weak joining force to an adjacent layer. For this reason, cracks tend to occur inside the low rigidity metal layer 25 and/or on the interface to the adjacent layer.

Since these low rigidity metal layers 25 are formed therein, the present embodiment obtains the same functions and effects as those of the low rigidity layers 11 in the first laminated piezoelectric element 1. In other words, each of the low rigidity metal layers 25 tends to be damaged upon polarizing or firing in a manufacturing process of a laminated piezoelectric element 1 and during the use of the laminated piezoelectric element 1. For this reason, the above-mentioned low rigidity metal layers make it possible to reduce the possibility of occurrence of cracks in the internal electrode 5 and the piezoelectric layer 3. Consequently, it becomes possible to provide a highly reliable laminated piezoelectric element 1 that can be driven in a stable manner.

Moreover, by installing the low rigidity metal layers 25, a position to cause a crack is easily predicted in the same manner as in the first laminated piezoelectric element 1 of the present invention. Therefore, the current-feeding units 13 to be electrically connected to the external electrodes 9 can be formed on a plurality of portions to be divided in a laminating direction by the low rigidity metal layers 25 without any loss.

Thus, at least a pair of the current-feeding units 13 are placed on the respective portions; therefore, even when ruptures occur in a plurality of portions of the external electrodes 9, it is possible to apply a voltage to each of the internal electrodes 5 in a stable manner. Consequently, it becomes possible to prevent a reduction in the displacement quantity of the laminated piezoelectric element 1 due to the occurrence of cracks.

In the same manner as in the first laminated piezoelectric element 1 of the present invention, the rigidities of the low rigidity metal layer 25, the piezoelectric layer 3 and the internal electrode 5 can be evaluated by using a JIS three-point bending test (JIS R 1601), a test in compliance with the JIS three-point bending test, or measurements of the Young's modulus.

Since the laminated piezoelectric element 1 of the present embodiment is provided with the low rigidity metal layers 25, a damage preferentially occurs on the low rigidity metal layer 25 and/or on the interface between the low rigidity metal layer 25 and the piezoelectric layer 3, rather than on the piezoelectric layer 3 and the internal electrodes 5, when subjected to the JIS three-point bending test. In this manner, it is possible to determine whether the low rigidity metal layer 25 is present, based upon whether the ruptured portion is generated on the piezoelectric layer 3 or the internal electrode 5, or on the low rigidity metal layer 25 or on the interface between the low rigidity metal layer 25 and the piezoelectric layer 3.

The low rigidity metal layer 25 is allowed to have rigidity lower than that of the piezoelectric layer 3 and the internal electrode 5 by using a material having rigidity lower than that of the piezoelectric layer 3 and the internal electrode 5, or by using a structure with many pores 17 formed therein, as will be described later.

Moreover, the external electrodes 9 are preferably separated from each other to one side and the other side on the side surfaces of the laminated structure 7 in the laminating direction based upon the low rigidity metal layer 25. Since the external electrodes 9 are separated from each other to one side and the other side on the side surfaces of the laminated structure 7 in the laminating direction based upon the low rigidity metal layer 25, it becomes possible to prevent a crack from occurring in an unexpected direction in the external electrodes 9.

Here, conductive bonding members 15, which are separated from each other to one side and the other side in the laminating direction based upon the low rigidity metal layer 25, are preferably disposed on the outer surface of the external electrodes 9. Since the conductive bonding members 15 are disposed in this manner, it is possible to electrically connect the external electrodes 9 to the current-feeding units 13 stably by using a simply process in the same manner as in a third laminated piezoelectric element 1 of the present invention.

Moreover, each low rigidity metal layer 25 is preferably provided with a plurality of metal portions 19 that are separated from one another. In the same manner as in the low rigidity layer 11, by forming the low rigidity metal layer 25 in this manner, it becomes possible to reduce the binding force inside the low rigidity metal layer 25 and/or the binding force thereof to an adjacent layer. Thus, the rigidity thereof can be further reduced.

In the same manner as in the measurement of the low rigidity layer 11, the composition of the low rigidity metal layer 25 having the metal portions 19 can be analyzed and measured by using an analyzing method, such as an EPMA (Electron Probe Micro Analysis) method.

As a material for the low rigidity metal layer 25, for example, metal of a simple substance, such as Cu and Ni, and an alloy, such as a silver-platinum alloy and a silver-palladium alloy, may be used. In particular, from the viewpoints of providing an anti-migration property, an anti-oxidation property, a low Young's modulus and a low price, a silver-palladium alloy is preferably used as its main component.

Here, the low rigidity metal layer 25 preferably has a plurality of metal portions 19 that are mutually separated from one another with a void 17 interposed therebetween. In the same manner as in the low rigidity layer 11, since the low rigidity metal layer 25 has such a structure, it is possible to further reduce the possibility of cracks occurring in the internal electrodes 5 and piezoelectric layer 3. Moreover, since the metal portions 19 that are mutually separated from one another with the void 17 interposed therebetween are prepared, it is possible to effectively reduce the possibility of an electrical short occurring through a crack generated in the low rigidity metal layer 25.

Here, the void ratio refers to a rate (%) of the area occupied by the voids 17 relative to the cross-sectional area of the laminated structure 7 on a cross section perpendicular to, or in parallel with a laminating direction of the laminated structure 7. In order to measure the void ratio, the same method as that of the low rigidity layer 11 may be used as described earlier.

The following description will discuss a tenth embodiment of the present invention.

Figure 13:
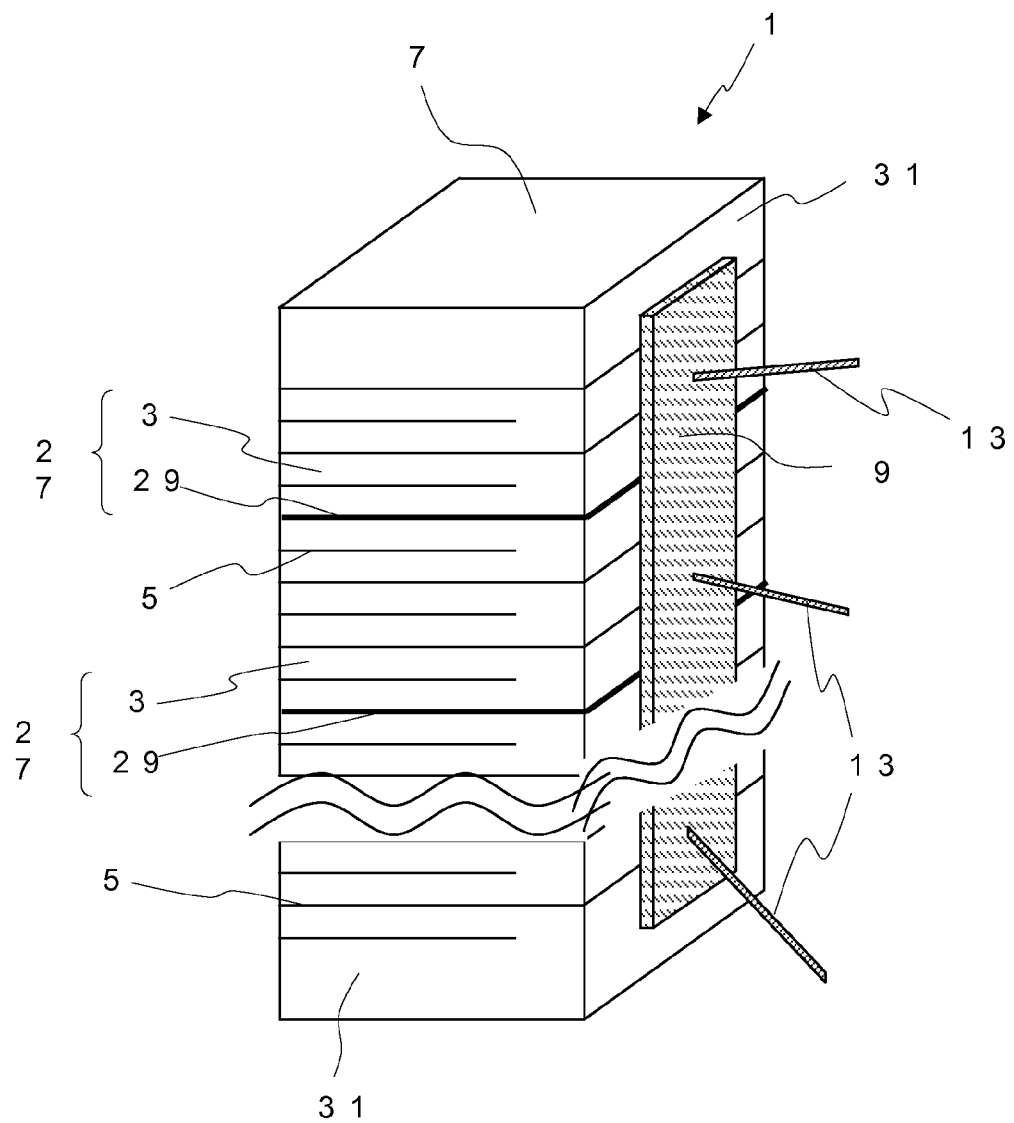
FIG. 13 is a perspective view showing a laminated piezoelectric element in accordance with a tenth embodiment of the present invention.

As shown in FIG. 13, a laminated piezoelectric element 1 is provided with a laminated structure 7 in which a plurality of ceramic layers 27 and a plurality of internal electrodes 5 are laminated alternately, and external electrodes 9 on an anode side and a cathode side, which are formed on the side surfaces of the laminated structure 7, and to which the internal electrodes 5 are connected. Moreover, each ceramic layer 27 is provided with a piezoelectric layer 3 and a low rigidity ceramic layer 29 having low rigidity in comparison with the piezoelectric layers 3 and the internal electrodes 5. Moreover, the laminated structure 7 has a plurality of portions divided by the low rigidity ceramic layers 29 in a laminating direction. At least a pair of current-feeding units 13 (power supply members) electrically connected to the external electrodes 9 on the anode side and the cathode side are disposed on each portion.

In the present embodiment, each low rigidity ceramic layer 29 refers to a layer that is low in rigidity in comparison with the piezoelectric layer 3 and the internal electrode 5, and has a weak joining force inside the layer and/or a weak joining force to an adjacent layer. For this reason, cracks tend to occur inside the low rigidity ceramic layer 29 and/or on the interface to the adjacent layer.

Since these low rigidity ceramic layers 29 are formed therein, the present embodiment obtains the same effects as those of the low rigidity layers 11 in the first laminated piezoelectric element 1. In other words, each of the low rigidity ceramic layers 29 tends to be damaged upon polarizing or firing in a manufacturing process of a laminated piezoelectric element 1 and during the use of the laminated piezoelectric element 1. For this reason, it becomes possible to reduce the possibility of cracks occurring in the internal electrode 5 and the piezoelectric layer 3. Consequently, it becomes possible to provide a highly reliable laminated piezoelectric element 1 that is operable in a stable manner.

Moreover, by installing the low rigidity ceramic layers 29, a position to cause a crack is easily predicted in advance in the same manner as in the first laminated piezoelectric element 1 of the present invention. Therefore, the current-feeding units 13 to be electrically connected to the external electrodes 9 can be formed on a plurality of portions to be divided in a laminating direction by the low rigidity ceramic layers 29 without any loss.

Thus, at least a pair of the current-feeding units 13 are placed on the respective portions; therefore, even when ruptures occur in a plurality of portions of the external electrodes 9, it is possible to apply a voltage to each of the internal electrodes 5 in a stable manner. Consequently, it becomes possible to prevent a reduction in the displacement quantity of the laminated piezoelectric element 1.

In the same manner as in the first laminated piezoelectric element 1 of the present invention, the rigidities of the low rigidity ceramic layer 29, the piezoelectric layer 3 and the internal electrode 5 can be evaluated by using a JIS three-point bending test (JIS R 1601), a test in compliance with the JIS three-point bending test, or measurements of the Young's modulus.

Since the laminated piezoelectric element 1 of the present embodiment is provided with the low rigidity ceramic layers 29, a rupture preferentially occurs on the low rigidity ceramic layer 29 or on the interface between the low rigidity ceramic layer 29 and the piezoelectric layer 3, rather than on the piezoelectric layer 3 and the internal electrodes 5, when subjected to the JIS three-point bending test. In this manner, it is possible to determine whether the low rigidity ceramic layer 29 is present, based upon whether the ruptured portion is generated on the piezoelectric layer 3 and the internal electrode 5, or on the low rigidity ceramic layer 29 or on the interface between the low rigidity ceramic layer 29 and the piezoelectric layer 3.

The low rigidity ceramic layer 29 is allowed to have rigidity lower than that of the piezoelectric layer 3 and the internal electrode 5 by using a material having rigidity lower than that of the piezoelectric layer 3 and the internal electrode 5, or by using a structure with many pores 17 formed therein, as will be described later.

Moreover, the external electrodes 9 are preferably separated from each other to one side and the other side on the side surfaces of the laminated structure 7 in the laminating direction based upon the low rigidity ceramic layer 29. Since the external electrodes 9 are separated from each other to one side and the other side on the side surfaces of the laminated structure 7 in the laminating direction based upon the low rigidity ceramic layer 29, it becomes possible to prevent a crack from occurring in an unexpected direction in the external electrodes 9.

Here, conductive bonding members 15, which are separated from each other to one side and the other side in the laminating direction based upon the low rigidity ceramic layer 29, are preferably disposed on the outer surface of the external electrodes 9. Since the conductive bonding members 15 are formed in this manner, it is possible to electrically connect the external electrodes 9 to the current-feeding units 13 stably by using a simply process in the same manner as in the third laminated piezoelectric element 1 of the present invention.

Moreover, each low rigidity ceramic layer 29 is preferably provided with a plurality of ceramic portions 21 that are separated from one another. In the same manner as in the low rigidity layer 11, by forming the low rigidity ceramic layer 29 in this manner, it becomes possible to reduce the binding force inside the low rigidity ceramic layer 29 and/or the binding force thereof to an adjacent layer. Thus, the rigidity thereof can be further reduced.

In the same manner as in the measurement of the low rigidity layer 11, the composition of the low rigidity ceramic layer 29 having the ceramic portions 21 can be analyzed and measured by using an analyzing method, such as an EPMA (Electron Probe Micro Analysis) method.

For example, a perovskite-type oxide, such as lead-zirconate-titanate ($PbZrO_3$—$PbTiO_3$), can be used as the ceramic portions 21.

Furthermore, the low rigidity ceramic layer 29 is preferably provided with a plurality of ceramic portions 21 that are separated from one another with a void 17 interposed therebetween. In the same manner as in one embodiment of the first laminated piezoelectric element 1 of the present invention, since the ceramic portions 21 themselves are more easily damaged, a stress, caused by the displacement of the piezoelectric layer 3, can be dispersed over a wide range. In this case, the void ratio of the low rigidity ceramic layer 29 is preferably set to 30% to 90%.

Here, in the present embodiment, the void ratio refers to a rate (%) of the area occupied by the voids 17 relative to the area of the low rigidity ceramic layer 29 on the cross section perpendicular to, or in parallel with a laminating direction of the laminated structure 7, in the same manner as in the low rigidity layer 11. In order to measure the void ratio, the same method as described earlier may be used.

Moreover, each ceramic portion 21 is preferably formed by a piezoelectric member. By forming each ceramic portion 21 by the piezoelectric member, a higher stress alleviating effect is exerted. This is because, by placing the piezoelectric members so as to be separated from each other, the ceramic portions 21 serving as the piezoelectric members are allowed to have a higher degree of freedom. In the case where the degree of freedom in the ceramic portions 21 becomes higher, upon occurrence of a stress in each ceramic portion 21, ion positions inside the piezoelectric crystal are moved so that the crystal structure is easily deformed in response to the direction of the stress. Thus, it becomes possible to obtain a high stress-alleviating effect.

The thickness of the piezoelectric layer 3 is preferably set to 0.05 mm or more. By setting the thickness of the piezoelectric layer 3 to 0.05 mm or more, it is possible to maintain a high insulating property between the adjacent internal electrodes 5, even upon application of a high voltage to the laminated piezoelectric element 1. With this structure, it becomes possible to obtain a greater displacement quantity. Moreover, the thickness of the piezoelectric layer 3 is preferably set to 0.25 mm or less. By setting the thickness of the piezoelectric layer 3 to 0.25 mm or less, it becomes possible to achieve a small size of the laminated piezoelectric element 1.

Any material may be used as the piezoelectric layer 3 as long as it is a ceramic material having a piezoelectric property. Preferably, a ceramic material having a high piezoelectric strain constant $d_{33}$ is preferably used. More specifically, for example, a piezoelectric ceramic material, mainly composed of lead titanate-zirconate $Pb(Zr, Ti)O_3$ or barium titanate $BaTiO_3$, may be used.

The thickness of each internal electrode 5 is preferably set to 1 to 10 μm. By setting the thickness of the internal electrode 5 to 1 μm or more, it becomes possible to apply a predetermined voltage in a stable manner. Moreover, by setting the thickness of the internal electrode 5 to 10 μm or less, it becomes possible to more positively prevent disconnection in the internal electrode 5.

As a material for the internal electrode 5, for example, metal of a simple substance, such as Cu and Ni, and an alloy, such as a silver-platinum alloy and a silver-palladium alloy, may be used. In particular, from the viewpoints of providing an anti-migration property, an anti-oxidation property, a low Young's modulus and a low price, a silver-palladium alloy is preferably used as its main component.

On the opposing side surfaces of the laminated structure 7, external electrodes 9 on the anode side and the cathode side are formed. To each of the external electrodes 9 on the anode side and the cathode side, internal electrodes 5 or, in some cases, low rigidity layers 11 are electrically connected alternately for every other layer. Here, since it is only necessary for the external electrode 9 to have the internal electrodes 5 electrically connected thereto alternately for every other layer, these may be formed either on the opposing side surfaces or on the adjacent side surfaces.

The thickness of each external electrode 9 is preferably set to 5 to 100 μm. By setting the thickness of the external electrode 9 to 5 μm or more, it becomes possible to apply a predetermined voltage to the respective internal electrodes 5 in a stable manner. In the case of the thickness of 100 μm or less, since the residual stress of the external electrode 9 is made smaller, it becomes possible to make the external electrode 9 less susceptible to separation from the laminated structure 7.

As a material for the external electrode 9, any material may be used as long as it has good conductivity. For example, metal of a simple substance, such as Cu and Ni, or an alloy thereof may be used. In particular, from the viewpoints of low electrical resistance and easiness in handling, silver or an alloy mainly composed of silver is preferably used.

Figure 14:
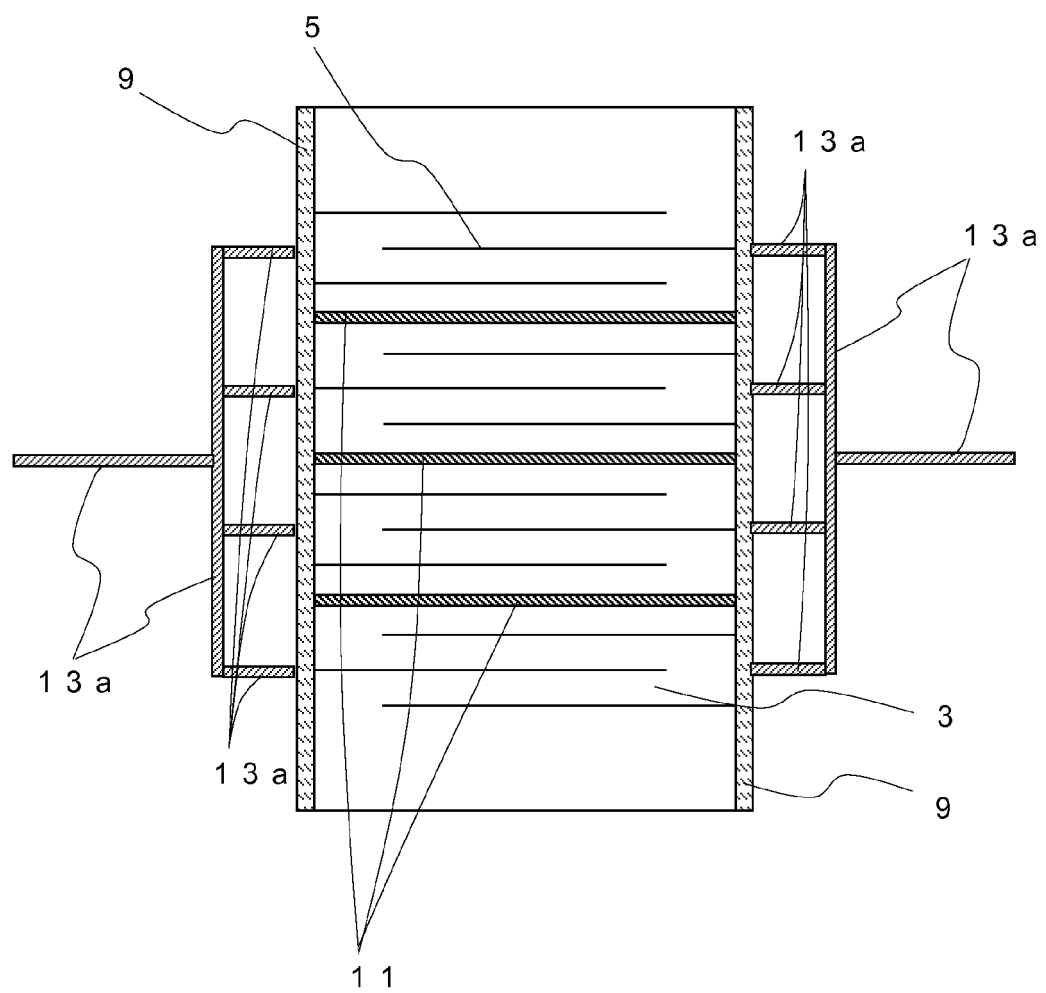
FIG. 14 is a cross-sectional view in a direction in parallel with a laminating direction, which shows a laminated piezoelectric element in accordance with an eleventh embodiment of the present invention.

As the current-feeding unit 13, any structure may be used as long as it allows the respective external electrodes 9 to be electrically connected to an external power supply. For example, as shown in FIG. 14, lead lines 13a may be connected to each external electrode 9 so as to form the current-feeding unit 13. Alternatively, as shown in FIG. 15, a metal plate 13b may be connected to each of the side surfaces of the laminated piezoelectric element 1 so as to form the current-feeding unit 13.

As a material for the current-feeding unit 13, although not particularly limited as long as it has conductivity, for example, metal of a simple substance, such as Cu and Ni, and an alloy, such as a silver-platinum alloy and a silver-palladium alloy, may be used.

The following description will discuss an eleventh embodiment and a twelfth embodiment of the present invention.

Figure 15:
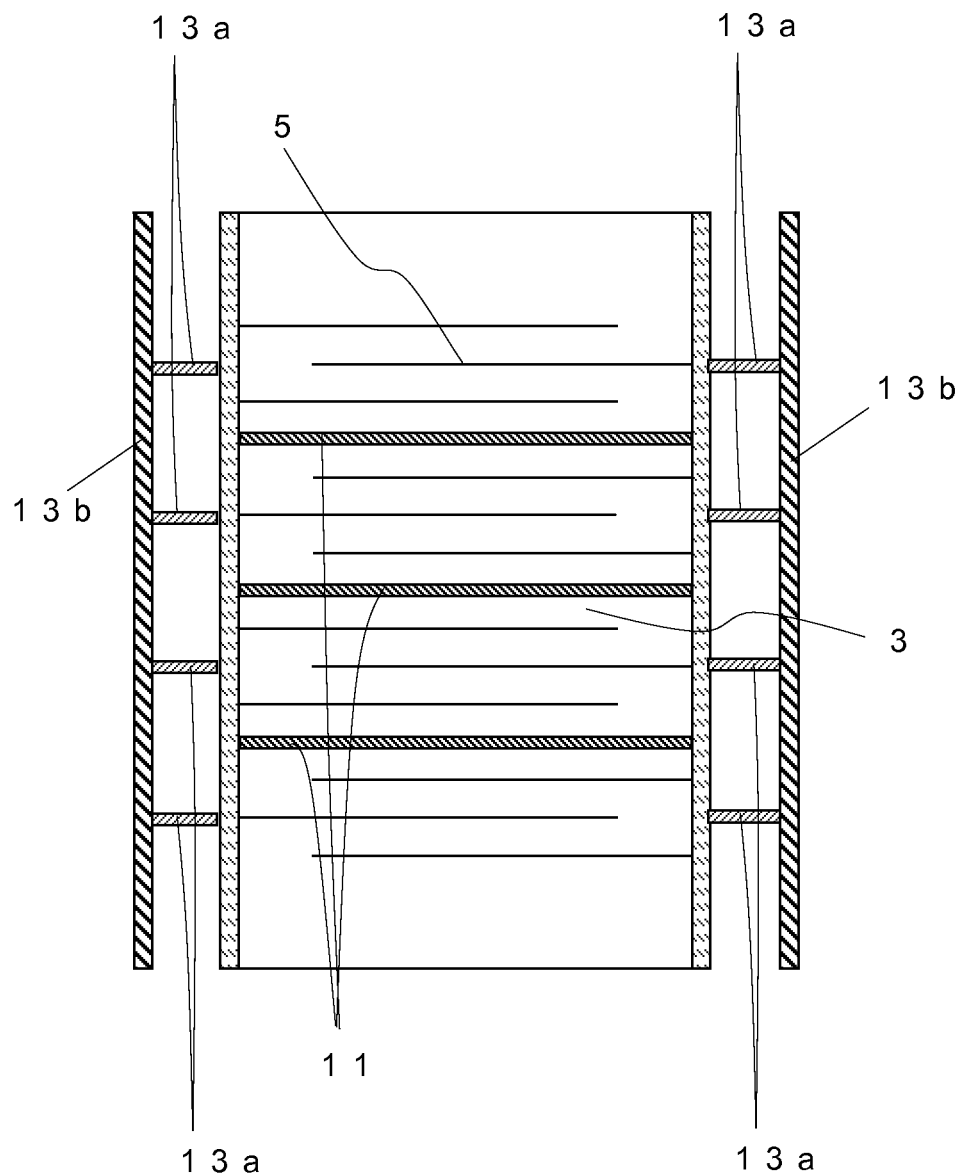
FIG. 15 is a cross-sectional view in a direction in parallel with a laminating direction, which shows a laminated piezoelectric element in accordance with a twelfth embodiment of the present invention.

As shown in FIGS. 14 and 15, the laminated piezoelectric element 1 preferably has a structure in which a plurality of current-feeding units 13 connected to the external electrodes 9a on the anode side and a plurality of current-feeding units 13 connected to the external electrodes 9b on the cathode side are connected to each other. Since this structure allows the current-feeding units 13 to be combined into one pair in the entire laminated piezoelectric element 1, it becomes possible to easily connect this to an external power supply.

Here, the current-feeding units 13 connected to the external electrodes 9a on the anode side and the current-feeding units 13 connected to the external electrodes 9b on the cathode side may be respectively connected to external power supplies in a separated manner. In this case, since the internal electrodes 5 electrically connected to the respective current-feeding units 13 can be respectively controlled in a separated manner, it is possible to change voltage values to be applied depending on the distribution of stresses, and consequently to suppress the concentration of stresses.

Moreover, as the method for separating the external electrodes 9 and the conductive bonding members 15 on the low rigidity layer 11, for example, a method is proposed in which resist is applied onto the low rigidity layer 11 so as not to allow the external electrodes 9 and the conductive bonding members 15 to intrude therein. In particular, this method is preferably used because the external electrodes 9 and the conductive bonding members 15 on the low rigidity layer 11 can be easily separated from each other.

It is preferable to form a low active layer 31 on each of the two end faces of the laminated structure 7 in the laminating direction. Since the internal electrode 5 is only disposed on one of main face sides, and no internal electrode 5 is disposed on the other main face side, the low active layer 31 has hardly any piezoelectric displacement even upon application of a voltage thereto. Since such a low active layer 31 is formed, it is possible to suppress a strain in the laminated structure 7 to be caused upon application of a voltage thereto. For example, a piezoelectric ceramic material mainly composed of barium titanate $BaTiO_3$ may be used as the material for the low active layer 31.

Furthermore, the low active layer 31 is preferably formed by using the same material as that of the piezoelectric layer 3, more specifically, by laminating a plurality of piezoelectric layers 3. By using the same material as that of the piezoelectric layer 3, it is manufactured easily without the necessity of using another material. Moreover, it becomes possible to suppress a strain to be generated during a firing process between the laminated structure 7 and the low active layer 31 or upon application of a voltage thereto, and consequently to form a piezoelectric element 1 with a solid structure.

Moreover, metal powder to form the internal electrodes 5, such as a silver-palladium alloy, is preferably added to a green sheet for the piezoelectric layer 3 forming the low active layer 31. Moreover, upon laminating the green sheet for the piezoelectric layer 3 forming the low active layer 31, a slurry, made from metal powder to form the internal electrodes 5, such as a silver-palladium alloy, as well as an inorganic compound, a binder and a plasticizer, is preferably printed on the green sheet. By forming the low active layer 31 in this manner, shrinking behaviors and rates of shrinkage between the low active layer 31 and the laminated structure 7 at the time of sintering can be mutually made closer. Thus, it becomes possible to form a piezoelectric element 1 with a solid structure.

Next, the following description will discuss a method for manufacturing the laminated piezoelectric element 1 of the present embodiment. First, temporary sintered powder of piezoelectric ceramics of a perovskite-type oxide mainly composed of $PbZrO_3$—$PbTiO_3$, a binder made from an organic polymer of an acryl type, a butyral type or the like, DBP (dibutyl phthalate) and DOP (dioctyl phthalate) plasticizers are mixed with one another to form a slurry. By using this slurry, a ceramic green sheet to form a piezoelectric layer 3 is produced by using a known tape-molding method, such as a doctor blade method or a calender roll method.

Next, in order to form the internal electrodes 5, a conductive paste is produced by adding a binder and a plasticizer to metal powder of a silver-palladium alloy or the like to be mixed therein. This conductive paste is placed on the ceramic green sheet by using a screen printing method so that the internal electrodes 5 are formed.

Moreover, in order to form a porous low rigidity layer 11 having the metal portions 19, a conductive paste, made by mixing acrylic beads for use as a component for scattering the binder and resin into the conductive paste, is prepared. By placing this conductive paste on the ceramic green sheet by using a screen printing method so that a low rigidity layer 11 is formed.

As a component forming the voids 17, any component may be used as long as it scatters during sintering and degreasing processes. For example, a binder or a resin, serving as a carbon component, may be used.

Here, the method for forming the voids 17 is not limited to the above-mentioned method. For example, by changing the number of degrees of a screen mesh or the pattern shape, the voids 17 can be formed.

More specifically, by setting the mesh size of the screen to 15 μm or less, the amount of ink paste passing through the screen is made insufficient so as to be intermittently outputted so that the voids 17 can be formed. Moreover, by masking the screen so as not to permeate the ink paste, portions through which no ink is permeated are formed into voids 17. As the shape of the masking for forming the voids 17, in particular, a virtually round shape, such as an elliptical shape and a round shape that have a high stress-alleviating effect, is preferably used.

Furthermore, by changing the ratio between the binder as well as the plasticizer and the metal powder, the number of degrees of the screen mesh, or the thickness of resist to form the pattern of the screen, the thickness of the low rigidity layer 11, or the shape of the voids 17, the void ratio or the like in the low rigidity layer 11, can be changed.

Here, in the case where the internal electrodes 5 are made from a silver-palladium alloy, by using a conductive paste having a high silver ratio in the silver-palladium alloy in comparison with the conductive paste to form the internal electrodes 5, it becomes possible to form the low rigidity layer 11 without the necessity of using complicated processes. This is because, when the laminated structure 7 is formed by carrying out a simultaneous sintering process, with the conductive paste having a high silver ratio being placed at positions where the low rigidity layer 11 is to be formed, silver is allowed to be gradually dispersed from the conductive paste having a high silver ratio. Voids are formed while silver is being dispersed. As a result, the conductive paste having a high silver ratio is allowed to form a low rigidity layer 11 that is lower in rigidity in comparison with the piezoelectric layer 3 and the internal electrodes 5.

Thus, the conductive paste to be formed into the low rigidity layer 11, thus prepared, is printed on the top surface of each of the green sheets with a thickness in a range from 1 to 40 μm, by using a screen printing or the like.

Moreover, in order to form the porous low rigidity layer 11 having the ceramic portions 21, a ceramic paste in which more acrylic beads that form a component for allowing the binder and/or the resin to scatter are mixed in comparison with the above-mentioned ceramic green sheet may be prepared. By placing such a ceramic paste on the ceramic green sheet by the use of a screen printing method, a low rigidity layer 11 having the ceramic portions 21 can be formed.

Then, a plurality of the green sheets on which the conductive paste has been printed are laminated, and this is subjected to a debinder treatment. At this time, in order to effectively form the voids 17 in the low rigidity layer 11, a degreasing process is preferably carried out at a temperature that is higher than Tg temperature of the scattering component.

Here, the temperature of the debinder treatment is preferably set in a range from 200 to 800° C. By setting the temperature of the debinder treatment to 200° C. or more, it becomes possible to prevent the laminated structure 7 from becoming too soft and consequently to make the low rigidity layer 11 in which the voids 17 are to be formed less susceptible to deformation. For this reason, the area and the shape of the voids 17 can be easily controlled. Moreover, by setting the temperature thereof to 800° C. or less, it becomes possible to allow the binder to easily scatter and consequently to prevent carbon from remaining therein. Thus, the displacement characteristic of the piezoelectric layer 3 can be stabilized.

Moreover, a laminated structure 7 is produced by carrying out a firing process at a temperature higher than the debinder temperature. The firing temperature is preferably set in a range from 900 to 1200° C. By setting the firing temperature to 900° C. or more, since the sintering of the piezoelectric layer 3 is further accelerated, it is possible to suppress influences to the displacement characteristic. Moreover, by setting the firing temperature to 1200° C. or less, since the fusing and decomposition of the low rigidity layer 11 are suppressed, it is possible to properly maintain the low rigidity layer 11. Consequently, the formation of the voids 17 can be carried out in a stable manner. Moreover, in order to effectively form the voids 17 in the low rigidity layer 11, it is preferable to keep a temperature higher than Tg temperature of the scattering component.

Here, not limited to the above-mentioned method, the laminated structure 7 can be produced by any method as long as the laminated structure 7 is designed so that a plurality of piezoelectric layers 3 and a plurality of internal electrodes 5 are laminated alternately.

Thereafter, in order to prevent the external electrodes 9 and/or the conductive bonding members 15 from being formed on portions positioned on the side of the low rigidity layer 11 of the side surface of the laminated structure 7, a resist coating process is carried out. Next, the external electrodes 9 are formed so as to be made conductive to the internal electrodes 5 whose end portions are exposed to the side surface of the laminated structure 7. The external electrodes 9 can be obtained through processes in which a silver glass conductive paste is prepared by adding a binder to glass powder and the conductive paste is printed and baked.

The firing temperature is preferably set to 500 to 800° C. Thus, by allowing silver in the silver glass conductive paste and the internal electrodes 5 to be diffusion-joined to each other, it becomes possible to more positively form a neck portion. Moreover, voids are allowed to effectively remain in the external electrodes 9.

Here, the external electrodes 9 may be prepared by carrying out a coating process with a conductive paste and a succeeding firing process as described above; however, the external electrodes 9 may also be formed by a method for bonding metal plates.

Next, the laminated structure 7 in which the external electrodes 9 are formed is immersed in a resin solution containing an outer coating resin made from silicone rubber. Moreover, by vacuum-degassing the silicone resin solution, the silicone resin is adhered to concave/convex portions on the peripheral side surfaces of the laminated structure 7. Thereafter, the laminated structure 7 is taken out of the silicone resin solution. Thus, the side surfaces of the laminated structure 7 are coated with the silicone resin.

Then, the lead line 13*a* serving as a current-feeding unit 13 is connected to each of the external electrodes 9 by the conductive bonding member 15 or the like.

By applying a DC voltage of 0.1 to 3 kV/mm to the paired external electrodes 9 through the lead lines 13*a*, the laminated structure 7 is subjected to a polarizing process. Thus, the laminated piezoelectric element 1 of the present embodiment is completed. The lead lines 13*a* are connected to an external voltage supply unit (not shown), and by applying a voltage to the internal electrodes 5 through the lead lines 13*a* serving as the current-feeding units 13 and the external electrodes 9, each piezoelectric layer 3 can be greatly displaced by a reverse piezoelectric effect. Thus, for example, the element is allowed to function as a fuel jetting valve for automobiles that injection-supplies fuel to an engine.

Moreover, a conductive assistant member (not shown) made of a metal mesh or a mesh-state metal plate may be embedded to the conductive bonding member 15. The conductive assistant member is embedded in the conductive bonding member 15 in such a manner that, even when the element is driven at a high speed, a large current is allowed to flow through the conductive assistant member. Thus, it is possible to prevent an excessive current from flowing through the external electrodes 9. Consequently, the external electrode 9 is effectively prevented from causing a local heat generation and a subsequent disconnection; thus, it becomes possible to greatly improve the durability.

In the case where the metal mesh or the mesh-state metal plate is embedded in the conductive bonding member 15, it is possible to reduce the possibility of the conductive bonding member 15 causing cracks. Here, as the metal mesh, for example, a member having knitted metal lines may be used. Moreover, as the mesh-state metal plate, for example, a member that is formed into a mesh by perforating a metal plate may be used.

The following description will discuss a jetting device in accordance with one embodiment of the present invention.

Figure 16:
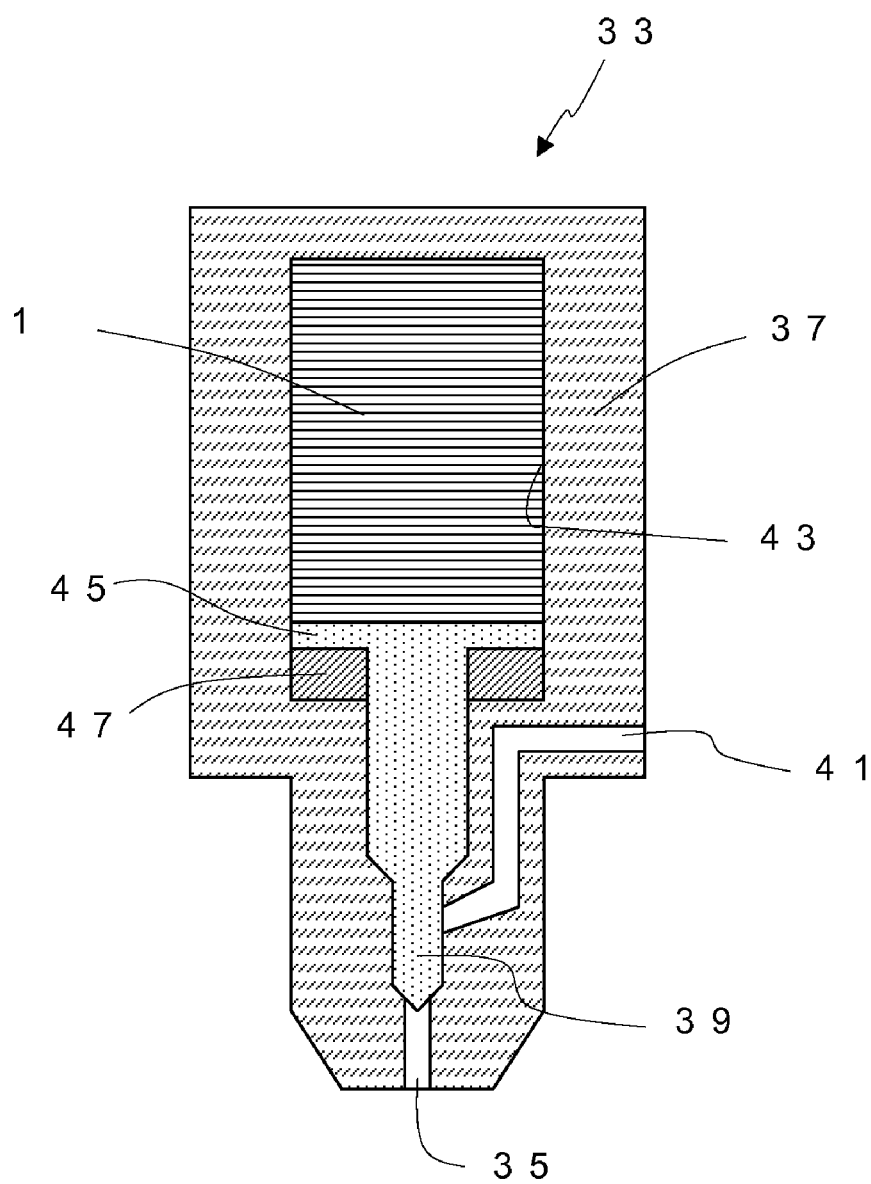
FIG. 16 is a cross-sectional view showing a jetting device in accordance with one embodiment of the present invention.

As shown in FIG. 16, in a jetting device 33, a laminated piezoelectric element typically 1 represented by the above-mentioned embodiment is housed inside a housing container 37 with a jetting hole 35 formed on its one end. A needle valve 39 that can open/close the jetting hole 35 is disposed in the housing container 37. A fuel passage 41 is attached to the jetting hole 35 so as to communicate therewith in response to the movements of the needle valve 39. This fuel passage 41 is coupled to an external fuel supply source so that a fuel is always supplied to the fuel passage 41 at a constant high pressure. Therefore, an arrangement is made so that, when the needle valve 39 opens the jetting hole 35, the fuel supplied to the fuel passage 41 is jetted into the fuel chamber of an internal combustion engine at a constant high pressure.

Moreover, the top end portion of the needle valve 39 has a bigger inner diameter, and a piston 45, which is allowed to slide and move inside a cylinder 43 formed in the housing container 37, is disposed therein. The above-mentioned laminated piezoelectric element 1 is housed in the housing container 37.

In this jetting device 33, when, upon application of a voltage, the laminated piezoelectric element 1 is extended, the piston 45 is pressed down so that the needle valve 39 closes the jetting hole 35 to stop the supply of the fuel. Moreover, when the applied voltage is stopped, the laminated piezoelectric element 1 is constricted, and a coned disc spring 47 pushes the piston 45 back so that the jetting hole 35 is allowed to communicate with the fuel passage 41 so that a fuel jetting operation is carried out.

The jetting device 33 of the present embodiment may be provided with a container having the jetting hole 35 and the laminated piezoelectric element 1, and designed so that a liquid filled in the container is discharged from the jetting hole 35 when the laminated piezoelectric element 1 is driven. That is, the laminated piezoelectric element 1 is not necessarily required to be placed inside a container, but is only required to have a structure in which a pressure is applied to the inside of the container when the laminated piezoelectric element 1 is driven. In the present embodiment, specific examples of the liquid include various liquid-state fluids, such as conductive paste, in addition to fuel, ink and the like.

The following description will discuss a fuel jetting system 49 in accordance with one embodiment of the present invention.

Figure 17:
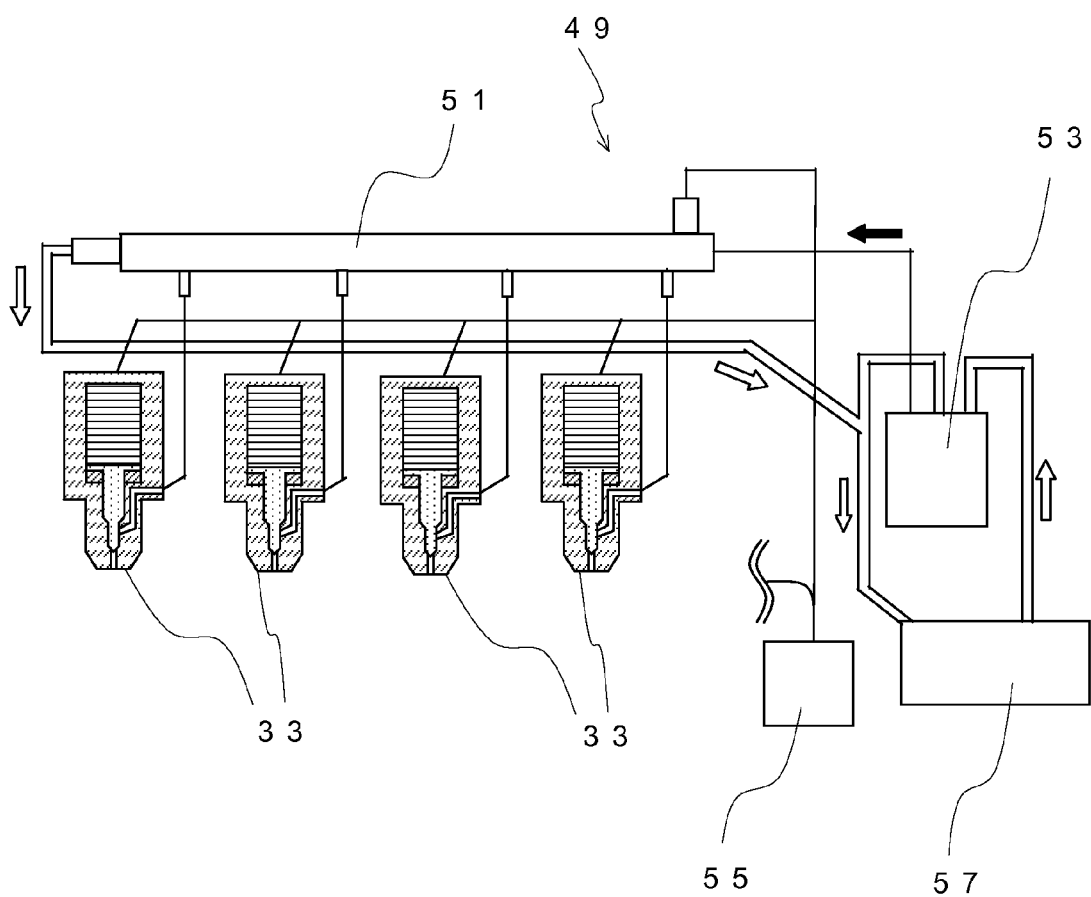
FIG. 17 is a schematic view showing a fuel jetting system in accordance with one embodiment of the present invention.

As shown in FIG. 17, the fuel jetting system 49 is provided with a common rail 51 used for storing a high-pressure fuel (pressurized liquid), a plurality of jetting devices 33 for jetting the fuel stored in the common rail 51, a pressure pump 53 used for supplying a high-pressure fuel to the common rail 51 and a jetting control unit 55 that gives driving signals to the jetting devices 33.

The jetting control unit 55 controls the amount of jetted fuel and the timing thereof, while sensing the states of the combustion chamber of the engine by sensors and the like. The pressure pump 53 functions so as to send the fuel from the fuel tank 57 to the common rail 51, with its pressure being set to approximately 1000 to 2000 atmospheres, more preferably, to approximately 1500 to 1700 atmospheres. The common rail 51 stores the fuel sent from the pressure pump 67, and sends the fuel to the jetting device 33 on demand. The jetting device 33 sprays a small amount of fuel from the jetting hole 35 into the combustion chamber as a mist, as described earlier.

Here, the present invention relates to the laminated piezoelectric element 1, the jetting device 33 and the fuel jetting system 49; however, not limited to the embodiments, the present invention is applicable to, for example, a fuel jetting device for an automobile engine, a liquid jetting device such as an ink-jet device, a precision positioning device for an optical apparatus or the like, a driving element (piezoelectric actuator) to be mounted on a vibration preventive device or the like, a sensor element to be mounted on a sensor, such as a burning pressure sensor, a knocking sensor, an acceleration sensor, a load sensor, an ultrasonic sensor, a pressure sensor and a yaw rate sensor, and a circuit element to be mounted on a device, such as a piezoelectric gyroscope, a piezoelectric switch, a piezoelectric transformer and a piezoelectric breaker, as well as an element other than these, which at least utilizes a piezoelectric characteristic.

The present invention is not intended to be limited by the embodiments, and various modifications may be made therein without departing from the gist and scope of the present invention.

EXAMPLES

Example 1

A laminated piezoelectric actuator provided with the laminated piezoelectric element of the present invention was manufactured in the following manner.

First, a slurry, formed by mixing temporary sintered powder of piezoelectric ceramics containing lead-titanate-zirconate ($PbZrO_3$—$PbTiO_3$) having an average particle size of 0.4 µm, a binder and a plasticizer with one another, was prepared. By using this slurry, a ceramic green sheet to be formed into a piezoelectric layer 3 with a thickness of 150 µm was produced by using a doctor blade method.

On one of the faces of this ceramic green sheet, a conductive paste to be formed into internal electrodes 5, prepared by adding a binder to a silver-palladium alloy, was applied by using a screen printing method. Here, 300 sheets, each having this conductive paste printed thereon, were laminated. Then, the laminated ceramic green sheets were fired at a temperature of 980 to 1100° C. so that a laminated fired body was obtained.

At this time, in order to form a low rigidity layer 11, sample No. 2 was subjected to a printing process so that, for every 20 ceramic green sheet layers, a conductive paste to be formed into a low rigidity layer 11 was formed with a thickness of 4 µm, in place of the conductive paste to be formed into the internal electrodes 5.

Here, the conductive paste to be formed into the low rigidity layer 11 was prepared by adding acrylic beads having an average particle size of 0.5 µm to a silver-palladium alloy so as to account for 200% by volume relative to 100% by volume of the silver-palladium alloy to be mixed therein, and by further adding a binder to this mixture. Then, the resulting laminated fired body was ground by a plane grinder so that a laminated structure 7 was obtained.

Next, silver powder having an average particle size of 2 µm, glass powder containing silica having an average particle size of 2 μm, with a softening point of 650° C., and a binder were mixed so that a silver glass conductive paste was prepared. This silver glass conductive paste was screen-printed on a portion of each side surface of the laminated structure 7 on which external electrodes 9 were to be formed, with a thickness of 30 μm. The laminated structure 7 with the silver glass conductive paste printed on each side surface was baked at 700° C. for 30 minutes so that a laminated structure 7, provided with external electrodes 9, was manufactured.

Moreover, solder made from lead, zinc and silver was used as the conductive bonding member 15. Upon printing this solder, resist used for reducing wettability to the low rigidity layer 11 was applied thereto. By applying the resist thereto in this manner, a sample (sample No. 2) was manufactured in which the solder was divided and divided portions were separated from each other to one side and the other side on the side surface of the laminated structure 7 in a laminating direction based upon the low rigidity layer 11.

Figure 2:
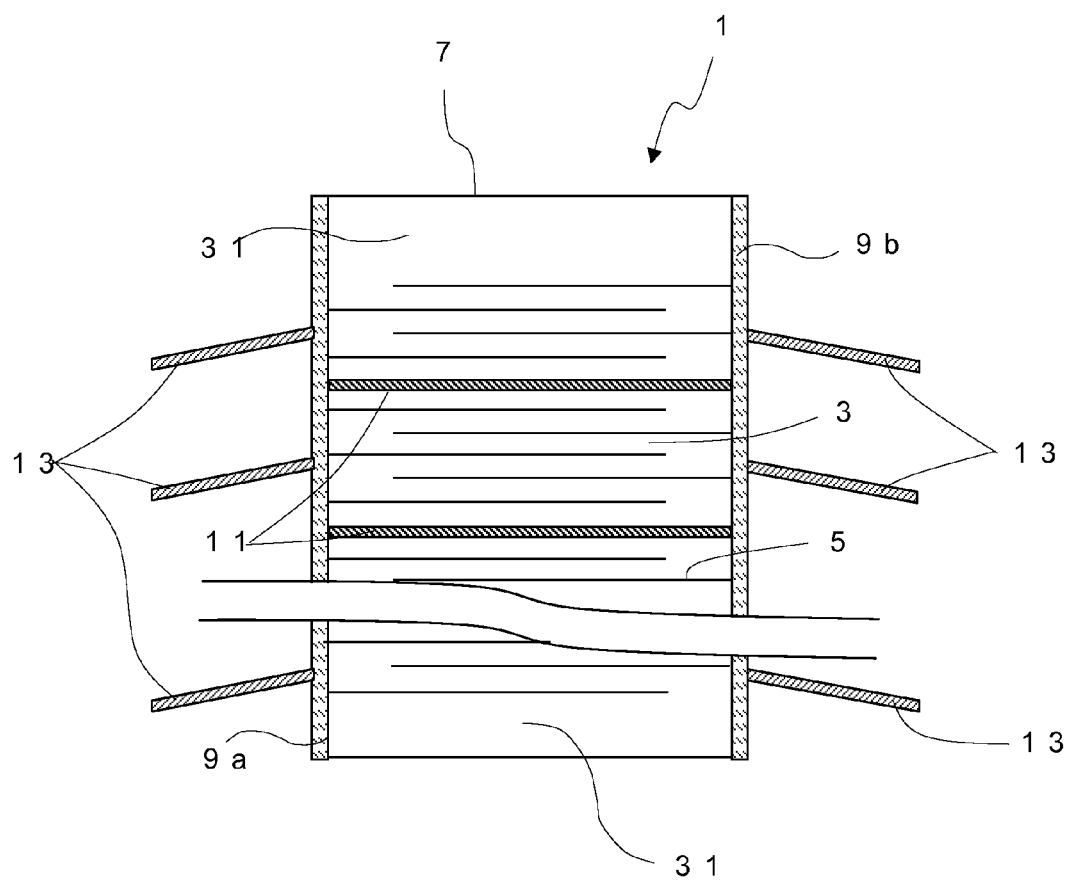
FIG. 2 is a cross-sectional view taken along line II-II of the embodiment shown in FIG. 1.

Then, the lead line 13*a* was connected to each of the external electrodes 9, and a polarizing process was carried out. In the polarizing process, a DC electric field of 3 kV/mm was applied to the positive-pole and negative-pole external electrodes 9 through the lead lines 13*a* for 15 minutes. Here, as shown in FIG. 16, in sample No. 1, the paired lead lines 13*a* were attached to only one end side of the laminated structure 7. As shown in FIG. 2, in sample No. 2, the paired lead lines 13*a* were attached to each of a plurality of portions divided in a laminating direction by the low rigidity layers 11.

Thus, a piezoelectric actuator provided with the laminated piezoelectric element 1 of the present invention was manufactured. When a DC voltage of 200 V was applied to the resulting laminated piezoelectric actuator, a displacement quantity of 40 μm was obtained in the laminating direction.

Moreover, an AC voltage of 0 to +200 V with a frequency of 150 Hz was applied to the laminated piezoelectric actuator at room temperature to be subjected to a test in which it was continuously driven $1\times10^4$ times. The results of the test are shown in Table 1.

TABLE 1

| Sample No. | Initial displacement quantity | Displacement quantity after driving operations of 1 × 104 times |
|---|---|---|
| 1 | 40 μm | 15 μm |
| 2 | 40 μm | 30 μm |

As shown in Table 1, in each of sample No. 1 and sample No. 2, the initial displacement quantity was the same value of 40 μm. However, after the continuous driving operations of $1\times10^4$ times, the displacement quantity of sample No. 1 was lowered to 15 μm, while the displacement quantity of sample No. 2 was lowered only to 30 μm; thus, it was confirmed that the maintaining performance of the displacement quantity of the piezoelectric actuator after the continuous driving operations was greatly improved.

Example 2

A laminated structure 7 was obtained by using the same method as example 1. Next, resist used for reducing wettability was applied to portions of the side surface of the laminated structure 7, located on the side of the low rigidity layer 11. Thereafter, silver powder having an average particle size of 2 μm and glass powder containing silica having an average particle size of 2 μm, with a softening point of 650° C., were mixed. Moreover, by adding a binder to this mixture, a silver glass conductive paste was prepared. This silver glass conductive paste was screen-printed on a portion of each side surface of the laminated structure 7 on which external electrodes 9 were to be formed, with a thickness of 30 μm.

The laminated structure 7 with the silver glass conductive paste printed on each side surface was baked at 700° C. for 30 minutes; thus, sample No. 3 was prepared in which the external electrodes 9 were separated from each other to one side and the other side on the side surfaces of the laminated structure 7 in the laminating direction based upon the low rigidity layer 11.

Moreover, upon printing solder made from lead, zinc and silver as the conductive bonding member 15, resist used for reducing wettability to the low rigidity layer 11 was applied to portions on the side surface of the laminated structure 7, located on the side of the low rigidity layer 11. Thus, a sample (sample No. 4) was manufactured in which the solder was divided and divided portions were separated from each other to one side and the other side on the side surface of the laminated structure 7 in the laminating direction based upon the low rigidity layer 11.

Here, in sample No. 3 and sample No. 4, the low rigidity layer 11 was formed by using a conductive paste to which acrylic beads were added, in the same manner as in sample No. 2. The low rigidity layer 11 in samples No. 3 and No. 4 had a structure in which metal portions 19 were scattered. The void ratio of the low rigidity layer 11 was examined, and found to be about 80%.

Thereafter, the paired lead lines 13*a* were attached to each of the external electrodes 9 separated from each other to one side and the other side in the laminating direction based upon the low rigidity layer 11. Moreover, a DC electric field of 3 kV/mm was applied to the positive-pole and negative-pole of the external electrodes 9 through the lead lines 13*a* for 15 minutes to carry out a polarizing process. Thus, piezoelectric actuators using the laminated piezoelectric elements 1 as shown in FIG. 3 (sample No. 3) and FIG. 4 (sample No. 4) were respectively manufactured.

When a DC voltage of 200 V was applied to each of the resulting laminated piezoelectric actuators, a displacement quantity of 40 μm was obtained in the laminating direction. Moreover, an AC voltage of 0 to +200 V with a frequency of 150 Hz was applied to the laminated piezoelectric actuator at room temperature to be subjected to a test in which it was continuously driven $1\times10^4$ times. The results of the test are shown in Table 2.

TABLE 2

| Sample No. | Initial displacement quantity | Displacement quantity after driving operations of 1 × 104 times |
|---|---|---|
| 3 | 40 μm | 35 μm |
| 4 | 40 μm | 40 μm |

As shown in Table 2, in both of the laminated piezoelectric actuator of sample No. 3 and the laminated piezoelectric actuator of sample No. 4, the initial displacement quantity was the same value of 40 μm. After the continuous driving operations, the displacement quantity of the laminated piezoelectric element 1 of sample No. 3 was 35 μm. Thus, it was confirmed that in the laminated piezoelectric element 1 of sample No. 3, the reduction in displacement quantity was suppressed to 5 μm so that the displacement quantity was maintained in a high level even after continuous driving operations for a long period of time. Moreover, in the laminated piezoelectric element 1 of sample No. 4, the displacement quantity after the continuous driving operations was 40 µm to cause no reduction.

The invention claimed is:

1. A laminated piezoelectric element, comprising:
   a laminated structure comprising:
   a plurality of laminated portions, wherein each of the laminated portions comprises a plurality of piezoelectric layers made of a material and a plurality of internal electrodes made of a material alternately laminated; and
   at least one low rigidity layer, wherein the at least one low rigidity layer divides the laminated portions from each other, and the at least one low rigidity layer is made of a material having a rigidity lower than a rigidity of the materials of each of the piezoelectric layers and each of the internal electrodes respectively.

2. The laminated piezoelectric element according to claim 1, wherein the at least one low rigidity layer is integrally fired with the piezoelectric layers and the internal electrodes.

3. The laminated piezoelectric element according to claim 1, wherein at the at least one low rigidity layer comprises a metal layer or a ceramic layer.

4. The laminated piezoelectric element according to claim 1, wherein the metal layer comprises a plurality of metal portions that are mutually separated from one another.

5. The laminated piezoelectric element according to claim 3, wherein the ceramic layer comprises a plurality of ceramic portions that are mutually separated from one another.

6. The laminated piezoelectric element according to claim 2, wherein the at least one low rigidity layer comprises a plurality of voids.

7. The laminated piezoelectric element according to claim 6, wherein the at least one low rigidity layer has a higher void ratio than each of the piezoelectric layers and each of the internal electrodes respectively.

8. The laminated piezoelectric element according to claim 1, wherein the internal electrodes comprise a plurality of anode side internal electrodes and a plurality of cathode side internal electrodes, wherein respective ends of the anode side internal electrodes are located on an anode side of the laminated structure, and respective ends of the cathode side internal electrodes are located on a cathode side of the laminated structure.

9. The laminated piezoelectric element according to claim 8, further comprising:
   an anode side external electrode electrically coupled to at least one of the anode side internal electrodes; and
   a cathode side external electrode electrically coupled to at least one of the cathode side internal electrodes,
   wherein the anode side external electrode and the cathode side external electrode are formed on side surfaces of the laminated structure.

10. The laminated piezoelectric element according to claim 9, further comprising:
    an anode side current-feeding unit electrically coupled to the anode side external electrode; and
    a cathode side current-feeding unit electrically coupled to the cathode side external electrode.

11. The laminated piezoelectric element according to claim 10, further comprising:
    an anode side conductive bonding member configured to electrically couple the anode side current-feeding unit to the anode side external electrode; and
    a cathode side conductive bonding member configured to electrically couple the cathode side current-feeding unit to the cathode side external electrode.

12. The laminated piezoelectric element according to claim 9, wherein the anode side external electrode and the cathode side external electrode are coupled to a plurality of the laminated portions.

13. The laminated piezoelectric element according to claim 12, further comprising:
    a plurality of anode side current-feeding units electrically coupled to the anode side external electrode; and
    a plurality of cathode side current-feeding units electrically coupled to the cathode side external electrode.

14. The laminated piezoelectric element according to claim 13, further comprising:
    a plurality of anode side conductive bonding members configured to electrically couple each of the anode side current-feeding units to the anode side external electrode, wherein the anode side conductive bonding members are separated from each other near the at least one low rigidity layer; and
    a plurality of cathode side conductive bonding members configured to electrically couple each of the cathode side current-feeding units to the cathode side external electrode, wherein the cathode side conductive bonding members are separated from each other near the at least one low rigidity layer.

15. The laminated piezoelectric element according to claim 8, further comprising:
    a plurality of anode side external electrodes each electrically coupled to one of the laminated portions via at least one of the anode side internal electrodes, wherein the anode side external electrodes are separated from each other near the at least one low rigidity layer; and
    a plurality of cathode side external electrodes each electrically coupled to one of the laminated portions via at least one of the cathode side internal electrodes, wherein the cathode side external electrodes are separated from each other near the at least one low rigidity layer, and
    wherein the anode side external electrodes and the cathode side external electrodes are formed on side surfaces of the laminated structure.

16. The laminated piezoelectric element according to claim 15, further comprising:
    a plurality of anode side current-feeding units electrically coupled to the anode side external electrodes respectively; and
    a plurality of cathode side current-feeding units electrically coupled to the cathode side external electrodes respectively.

17. The laminated piezoelectric element according to claim 16, further comprising:
    a plurality of anode side conductive bonding members configured to electrically couple each of the anode side current-feeding units to each of the anode side external electrodes respectively; and
    a plurality of cathode side conductive bonding members configured to electrically couple each of the cathode side current-feeding units to each of the cathode side external electrodes respectively.

18. The laminated piezoelectric element according to claim 1, wherein:
    at least one of the piezoelectric layers includes a thickness that is at least about 0.05 mm and at most about 0.25 mm, and
    at least one of the internal electrodes includes a thickness that is at least about 1 mm and at most about 10 mm.

19. The laminated piezoelectric element according to claim 1, further comprising a jetting hole configured to discharge a liquid when the laminated piezoelectric element is driven.

20. The laminated piezoelectric element according to claim 19, further comprising a container configured to store a pressurized liquid.

21. The laminated piezoelectric element according to claim 20, wherein the jetting hole is further configured to spray the pressurized liquid.

22. The laminated piezoelectric element according to claim 21, further comprising a jetting control unit configured to output a driving signal to the laminated structure to control the spray of the pressurized liquid through the jetting hole.

23. The laminated piezoelectric element according to claim 22, further comprising a common rail fuel injection system.

24. A crack suppression method for a laminated piezoelectric element, the method comprising:
    forming a plurality of laminated sections, wherein each of the laminated sections comprises a plurality of piezoelectric layers made of a material and a plurality of internal electrodes made of a material alternately laminated; and
    forming a laminated structure comprising the laminated sections and at least one low rigidity layer made of a material alternately provided, wherein the at least one low rigidity layer divides the laminated sections from each other, and the material of the at least one low rigidity layer has a rigidity lower than a rigidity of the materials of each of the piezoelectric layers and each of the internal electrodes respectively.

25. The crack suppression method according to claim 24, wherein the at least one low rigidity layer reduces crack formation in the piezoelectric layers and the internal electrodes respectively.

26. A laminated piezoelectric element, comprising:
    a plurality of laminated portions, wherein each of the laminated portions comprises a plurality of piezoelectric layers made of a material and a plurality of internal electrodes made of a material alternately laminated; and
    at least one low-rigidity means located between the laminated portions, wherein the at least one low-rigidity means made of a material of rigidity lower than a rigidity of the materials of each of the piezoelectric layers and each of the internal electrodes respectively.

* * * * *